(12) United States Patent
Kang et al.

(10) Patent No.: US 12,733,375 B2
(45) Date of Patent: Sep. 8, 2026

(54) ELECTROLUMINESCENT DISPLAY DEVICE

(71) Applicant: LG Display Co., Ltd., Seoul (KR)

(72) Inventors: Seongho Kang, Seoul (KR); Jeongoh Kim, Goyang-si (KR); MyungJae Yoo, Paju-si (KR); Geumyoung Lee, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 675 days.

(21) Appl. No.: 18/090,226

(22) Filed: Dec. 28, 2022

(65) Prior Publication Data

US 2023/0209973 A1 Jun. 29, 2023

(30) Foreign Application Priority Data

Dec. 28, 2021 (KR) ........................ 10-2021-0189457

(51) Int. Cl.
*H10K 59/80* (2023.01)
*H10K 59/121* (2023.01)
*H10K 59/122* (2023.01)

(52) U.S. Cl.
CPC ....... *H10K 59/873* (2023.02); *H10K 59/1213* (2023.02); *H10K 59/122* (2023.02)

(58) Field of Classification Search
CPC ................ G06F 1/1637; H10K 59/124; H10K 59/1213; H10K 59/122; H10K 59/873
See application file for complete search history.

(56) References Cited

U.S. PATENT DOCUMENTS

| | | | | |
|---|---|---|---|---|
| 2015/0340655 | A1* | 11/2015 | Lee | H10K 59/8731 257/40 |
| 2016/0218317 | A1* | 7/2016 | Hong | H10K 59/871 |
| 2016/0308163 | A1* | 10/2016 | Yoon | H10K 59/873 |
| 2017/0052405 | A1* | 2/2017 | Yu | G02F 1/13394 |
| 2021/0376291 | A1* | 12/2021 | Park | H10K 59/88 |

FOREIGN PATENT DOCUMENTS

| | | | |
|---|---|---|---|
| CN | 107068894 | A | 8/2017 |
| CN | 112542492 | A | 3/2021 |
| CN | 113725265 | A | 11/2021 |
| KR | 10-2007-0013574 | A | 1/2007 |
| KR | 10-2007-0078178 | A | 7/2007 |
| KR | 10-2017-0023337 | A | 3/2017 |
| KR | 10-2019-0007983 | A | 1/2019 |
| KR | 10-2021-0034876 | A | 3/2021 |

* cited by examiner

*Primary Examiner* — Vongsavanh Sengdara
(74) *Attorney, Agent, or Firm* — Birch, Stewart, Kolasch & Birch, LLP

(57) ABSTRACT

An electroluminescent display device can include a lower substrate divided into an active area and a non-active area, a thin film transistor disposed above the lower substrate, a planarization layer disposed above the thin film transistor, a light emitting diode disposed above the planarization layer, a bank disposed on the planarization layer to partition an emission area, an upper substrate disposed opposite to the lower substrate, a filler filled in a space between the upper substrate and the light emitting diode, a dam structure enclosing the filler in the non-active area, a plurality of alignment holes disposed between the active area and the dam structure, and a plurality of guide pins provided in the upper substrate of the non-active area to be fitted into the plurality of alignment holes. By doing this, the color mixture defect due to the bonding defect can be suppressed or minimized.

19 Claims, 13 Drawing Sheets

ELECTROLUMINESCENT DISPLAY DEVICE

CROSS-REFERENCE TO RELATED APPLICATIONS

This application claims priority to Korean Patent Application No. 10-2021-0189457 filed on Dec. 28, 2021, in the Republic of Korea, the entire contents of which are hereby expressly incorporated by reference into the present application.

BACKGROUND

Field

The present disclosure relates to an electroluminescent display device, and more particularly, to an electroluminescent display device in which self-alignment is performed.

Discussion of the Related Art

Currently, as the world enters a full-scale information era, a field of a display device which visually expresses electrical information signals has been rapidly developed. As such, studies continue to improve performances of various display devices such as a thin-thickness, a light weight, and low power consumption.

As a representative display device, there are a liquid crystal display device (LCD), an electro-wetting display device (EWD), and an organic light emitting display device (OLED).

Among such displays, an electroluminescent display device including an organic light emitting display device is a self-emitting display device since a separate light source is not needed, which is different from a liquid crystal display device. Therefore, the electroluminescent display device can be manufactured to have a light weight and a small thickness.

Further, since the electroluminescent display device is advantageous not only in terms of power consumption due to the low voltage driving, but also in terms of color implementation, a response speed, a viewing angle, a contrast ratio (CR), it is expected to be utilized in various fields.

The electroluminescent display device is configured by disposing a light emitting layer which uses an organic material between two electrodes referred to as an anode and a cathode. When holes in the anode are injected into the light emitting layer and electrons in the cathode are injected into the light emitting layer, the injected holes and electrons are recombined and form excitons in the light emitting layer to emit light.

SUMMARY OF THE DISCLOSURE

An object to be achieved by the present disclosure is to provide an electroluminescent display device which suppresses the color mixture defect due to the bonding defect.

Another object to be achieved by the present disclosure is to provide an electroluminescent display device which improves a yield by the self-alignment.

Objects of the present disclosure are not limited to the above-mentioned objects, and other objects, which are not mentioned above, can be clearly understood by those skilled in the art from the following descriptions.

In order to achieve the above-described objects, according to an aspect of the present disclosure, an electroluminescent display device includes a lower substrate which is divided into an active area and a non-active area, a thin film transistor disposed above the lower substrate, a planarization layer disposed above the thin film transistor, a light emitting diode which is disposed above the planarization layer and is configured by an anode, a light emitting unit, and a cathode, a bank which is disposed on the planarization layer to partition an emission area, an upper substrate which is opposite to the lower substrate, a filler which is filled in a space between the upper substrate and the light emitting diode, a dam structure which encloses the filler in the non-active area, a plurality of alignment holes which is disposed between the active area and the dam structure and is provided by removing the bank and a plurality of guide pins which is provided on the upper substrate of the non-active area to be fitted into the plurality of alignment holes.

Other detailed matters of the embodiments are included in the detailed description and the drawings.

According to the present disclosure, the bonding can be performed by forming a guide pin on an upper substrate and forming an alignment hole in a lower substrate to suppress the color mixture defect due to the bonding defect. Further, the yield can be improved by the self-alignment.

According to the present disclosure, a critical dimension of an alignment hole can be measured to be used as a test key to efficiently manage the yield and an alignment hole can be disposed inside the dam to optimize the alignment fluctuation.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
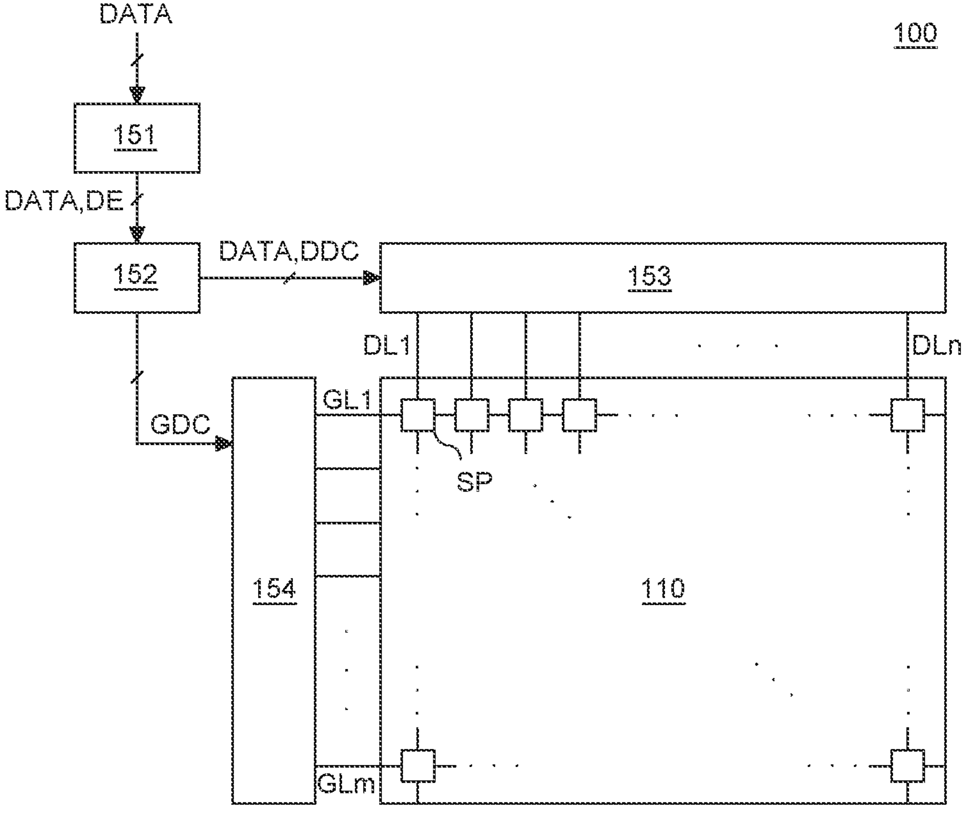
FIG. 1 is a block diagram of an electroluminescent display device according to a first embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted or may be provided briefly to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components, and may not define any order or sequence. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various exemplary embodiments of the present disclosure will be described in detail with reference to the accompanying drawings. All the components of each electroluminescent display device according to all embodiments of the present disclosure are operatively coupled and configured.

FIG. 1 is a block diagram of an electroluminescent display device according to a first embodiment of the present disclosure.

Referring to FIG. 1, an electroluminescent display device 100 according to the first embodiment of the present disclosure includes an image processor 151, a timing controller 152, a data driver 153, a gate driver 154, and a display panel 110.

The image processor 151 outputs a data signal DATA and a data enable signal DE by a data signal DATA supplied from the outside.

The image processor 151 can output one or more of a vertical synchronization signal, a horizontal synchronization signal, and a clock signal in addition to the data enable signal DE.

The timing controller 152 is supplied with the data signal DATA together with a driving signal including the data enable signal DE or the vertical synchronization signal, the horizontal synchronization signal, and the clock signal, from the image processor 151. The timing controller 152 can output a gate timing control signal GDC for controlling an operation timing of the gate driver 154 and a data timing control signal DDC for controlling an operation timing of the data driver 153, based on the driving signal.

At this time, the data driver 153 samples and latches the data signal DATA supplied from the timing controller 152 in response to the data timing control signal DDC supplied from the timing controller 152 to convert the data signal into a gamma reference voltage and output the converted gamma reference voltage. The data driver 153 outputs the data signal DATA through data lines DL1 to DLn, where n can be a positive number such as an integer greater than 1.

Further, the gate driver 154 can output the gate signal while shifting a level of the gate voltage, in response to the gate timing control signal GDC supplied from the timing controller 152. The gate driver 154 can output the gate signal through gate lines GL1 to GLm, where m can be a positive number such as an integer greater than 1.

The display panel 110 can display images while a sub pixel SP emits light in response to the data signal DATA and the gate signal supplied from the data driver 153 and the gate driver 154. A detailed structure of the sub pixel SP will be described in detail with reference to FIGS. 2 and 5.

Figure 2:
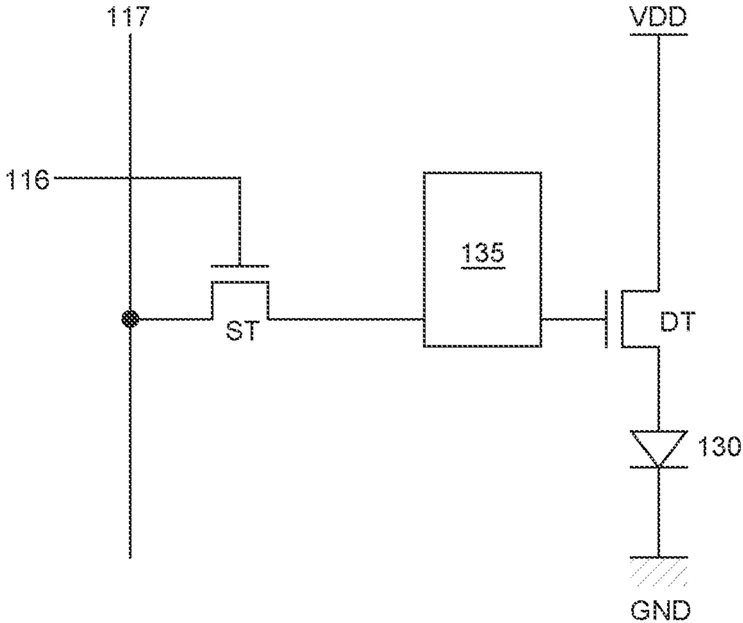
FIG. 2 is a circuit diagram of a sub pixel of an electroluminescent display device according to the first embodiment of the present disclosure.

FIG. 2 is a circuit diagram of a sub pixel of the electroluminescent display device according to the first embodiment of the present disclosure.

Referring to FIG. 2, the sub pixel of the electroluminescent display device according to the first embodiment of the present invention includes a switching transistor ST, a driving transistor DT, a compensation circuit 135, and a light emitting diode 130.

The light emitting diode 130 can operate to emit light in accordance with a driving current formed by the driving transistor DT.

The switching transistor ST can perform a switching operation such that a data signal supplied through the data line 117 is stored in a capacitor as a data voltage in response to a gate signal supplied through the gate line 116.

Further, the driving transistor DT can operate to flow a predetermined driving current between a high potential power line VDD and a low potential power line GND in response to a data voltage stored in the capacitor.

The compensation circuit 135 is a circuit for compensating for a threshold voltage of the driving transistor DT and incudes one or more thin film transistors and capacitors. A configuration of the compensation circuit 135 can vary depending on a compensating method.

The sub pixel illustrated in FIG. 2 is configured by a 2T (transistor) 1C (capacitor) structure including a switching transistor ST, a driving transistor DT, a capacitor, and a light emitting diode 130. When the compensation circuit 135 is added, the sub pixel can be formed in various forms, such as 3T1C, 4T2C, 5T2C, 6T1C, 6T2C, 7T1C, and 7T2C.

Figure 3:
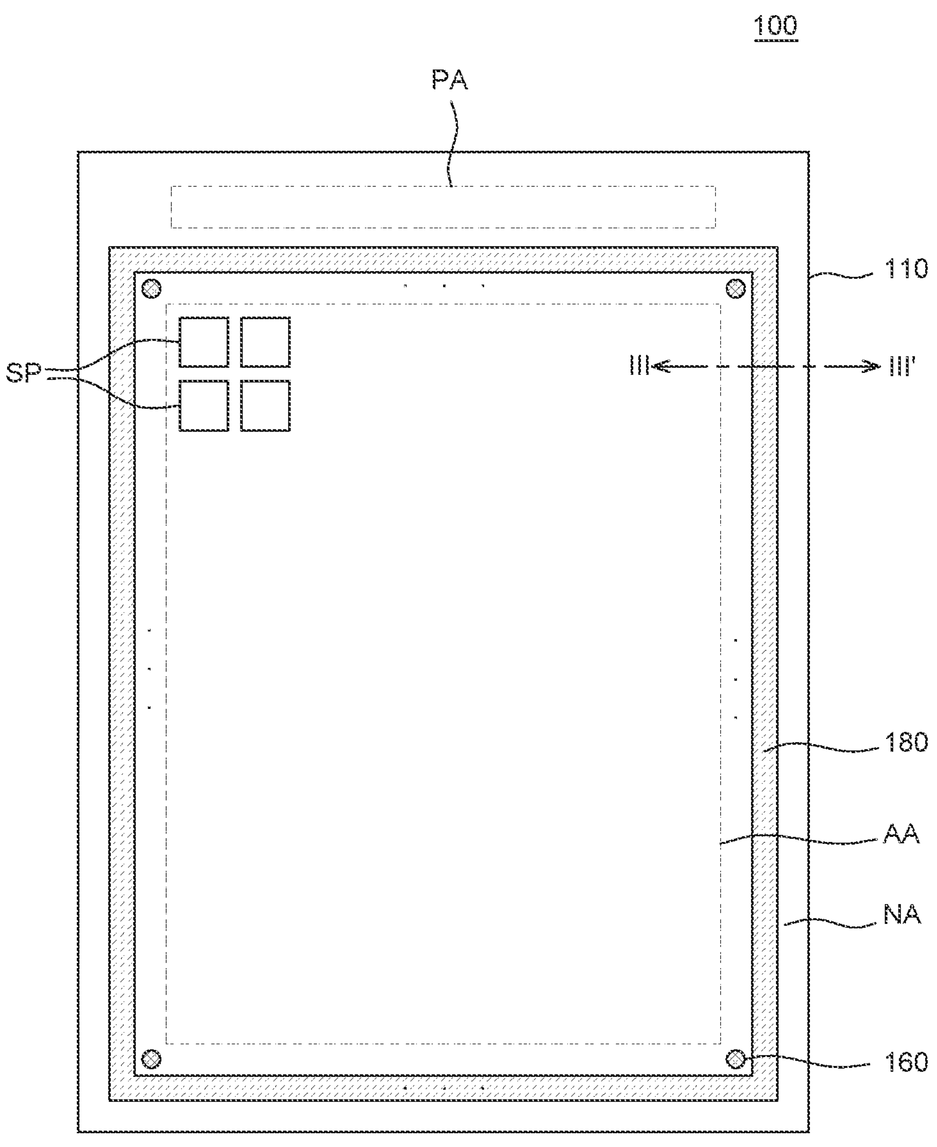
FIGS. 3 and 4 are plan views of the electroluminescent display device according to the first embodiment of the present disclosure.
Figure 4:
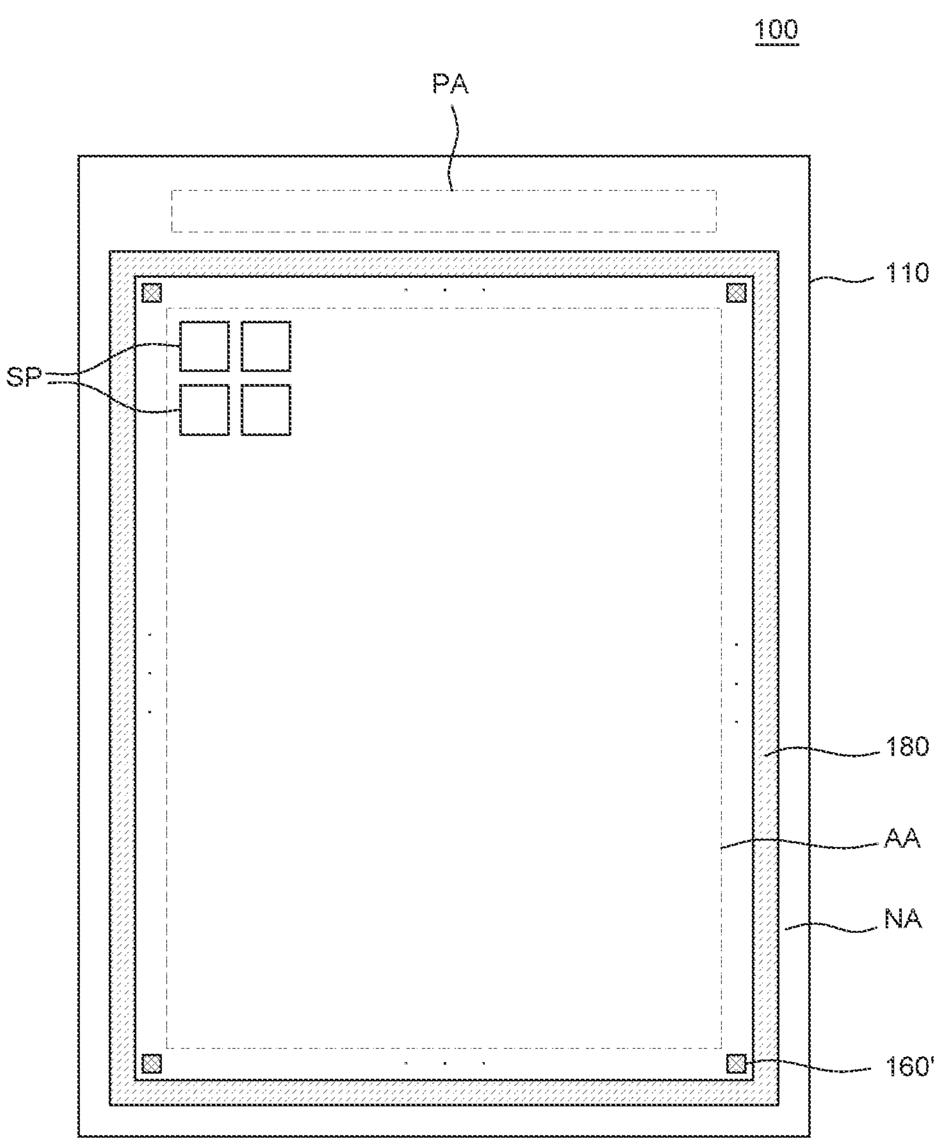

FIGS. 3 and 4 are plan views of an electroluminescent display device according to the first embodiment of the present disclosure.

Figure 5:
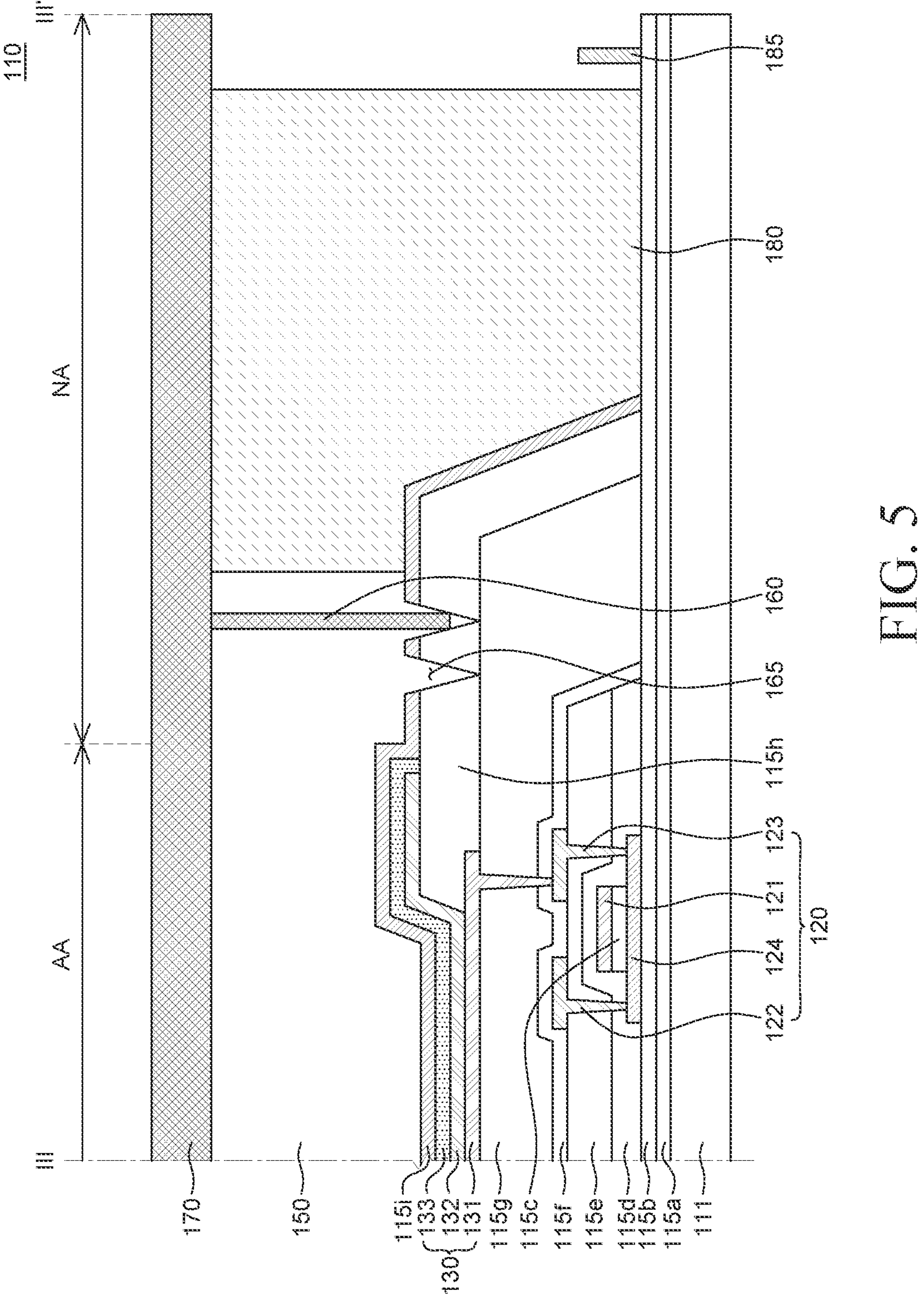
FIG. 5 is a cross-sectional view taken along the line of FIG. 3.

FIG. 5 is a cross-sectional view taken along the line of FIG. 3.

Referring to FIGS. 3 and 4, the electroluminescent display device 100 according to the first embodiment of the present disclosure includes a display panel 110 which is divided into an active area AA and a non-active area NA.

The display panel 110 is a panel for displaying images to a user.

The display panel 110 can include a display element which displays images, a driving element which drives the display element, and wiring lines which transmit various signals to the display element and the driving element. The display element can be defined in different ways depending on a type of the display panel 110. For example, when the display panel 110 is an organic light emitting display panel, the display element can be a light emitting diode which includes an anode, an organic light emitting layer, and a cathode.

Hereinafter, even though the display panel 110 is assumed as an organic light emitting display panel, the display panel 110 is not limited to the organic light emitting display panel.

The active area AA is an area where images are displayed in the display panel 110.

In the active area AA, a plurality of sub pixels SP which configures a plurality of pixels and a circuit for driving the plurality of sub pixels SP can be disposed. The plurality of sub pixels SP is minimum units which configure the active area AA and a display element can be disposed in each of the plurality of sub pixels SP. The plurality of sub pixels SP can configure a pixel. For example, a light emitting diode which includes an anode, an organic light emitting layer, and a cathode can be disposed in each of the plurality of sub pixels SP, but it is not limited thereto. Further, a circuit for driving the plurality of sub pixels SP can include a driving element and a wiring line. For example, the circuit can be configured by a thin film transistor, a storage capacitor, a gate line, and a data line, but is not limited thereto.

Each of the plurality of sub pixels SP is an area which displays one color and includes an area of the active area AA in which a light emitting diode is disposed. The plurality of sub pixels SP can be configured by a red sub pixel, a green sub pixel, and a blue sub pixel or can be configured by a red sub pixel, a green sub pixel, a blue sub pixel, and a white sub pixel. For the sake of convenience, the plurality of sub pixels SP can be defined as a matrix, as illustrated in FIGS. 3 and 4, but is not limited thereto.

The non-active area NA is an area where no image is displayed.

Even though in FIGS. 3 and 4, it is illustrated that the non-active area NA encloses a quadrangular active area AA, shapes and placements of the active area AA and the non-active area NA are not limited to the example illustrated in FIGS. 3 and 4.

The active area AA and the non-active area NA can have shapes suitable for a design of an electronic device including the electroluminescent display device 100. For example, another exemplary shape of the active area AA can be a pentagon, a hexagon, a circle, or an oval and the non-active area NA can have an arbitrary shape which encloses the active area AA.

In the non-active area NA, various wiring lines and circuits for driving the light emitting diode of the active area AA are disposed. For example, in the non-active area NA, a link line which transmits signals to the plurality of sub pixels SP and circuits of the active area AA or a driving IC, such as a gate driver IC or a data driver IC, can be disposed, but it is not limited thereto.

The gate drive IC is independently formed from the display panel 110 to be electrically connected to the display panel 110 in various methods, but can also be configured as a gate in panel (GIP) to be mounted in the display panel 110.

The non-active area NA includes a pad area PA.

The pad area PA can be disposed at the outside of a dam structure 180 disposed in the non-active area NA. The pad area PA is an area in which a pad electrode is formed and a pad electrode and an external module, for example, a flexible printed circuit board (FPCB) or a chip on film (COF) is in contact with the pad area PA. The pad area PA can be disposed on one side of the lower substrate, and the shape and the placement of the pad area PA are not limited thereto.

The electroluminescent display device 100 can further include various additional elements to generate various signals or drive the pixel in the active area AA. The additional elements for driving the pixels can include an inverter circuit, a multiplexer, or an electrostatic discharge circuit (ESD). The electroluminescent display device 100 can also include an additional element associated with a function other than a pixel driving function. For example, the electroluminescent display device 100 can include additional elements which provide a touch sensing function, a user authentication function (for example, fingerprint recognition), a multilevel pressure sensing function, or a tactile feedback function. The additional elements can be located in an external circuit which is connected to the non-active area NA and/or the connecting interface.

The upper substrate on which the dam structure is formed and a lower substrate on which the TFT and the light emitting diode are formed are bonded using a vacuum laminator. However, when misalignment is generated during the alignment process, the color mixture defect of the display panel can be caused.

For example, after performing the alignment by placing the upper substrate on which the dam structure is formed below and the lower substrate on which the TFT and the light emitting diode are formed above, the bonding is performed by dropping the lower substrate from top to bottom. According to the bonding method through the free fall, the misalignment is generated vertically and horizontally, regardless of a predetermined align value, which causes the color mixture defect of the display panel.

Therefore, an object of the present disclosure is to provide an electroluminescent display device 100 which suppresses the color mixture defect due to the bonding defect and improves the yield by the self-alignment.

To this end, according to a first embodiment of the present disclosure, the bonding is performed by forming guide pins 160 and 160' on the upper substrate and forming an alignment hole in the lower substrate to suppress the color mixture defect due to the bonding defect. By doing this, the yield is improved.

The guide pins 160 and 160' have a circular cross-section as illustrated in FIG. 3, or has a quadrangular cross-section as illustrated in FIG. 4, but are not limited thereto.

The guide pins 160 and 160' can be disposed along the periphery of the active area AA inside the dam structure 180, but are not limited thereto.

The guide pins 160 and 160' can be disposed at the corner of the active area AA, but are not limited thereto.

For example, referring to FIGS. 3 to 5, the lower substrate 111 can be divided into an active area AA and a non-active area NA at the outside of the active area AA.

At this time, the active area AA is an area in which the light emitting diode 130 is disposed so that an actual image is displayed and the non-active area NA is an outer peripheral area which encloses the active area AA. In the non-active area NA, images are not displayed and various driving elements for driving the light emitting diode 130 can be disposed.

A thin film transistor 120, the light emitting diode 130, and an encapsulation layer 115*i* can be formed in the active area AA of the lower substrate 111.

In the non-active area NA of the lower substrate 111, the encapsulation layer 115*i*, the alignment hole 165, and the dam structure 180 are formed.

The lower substrate 111 serves to support and protect components of the electroluminescent display device disposed above.

Recently, the flexible lower substrate 111 can use a soft material having a flexibility such as plastic. At this time, the lower substrate 111 can be a film type including one of a group consisting of a polyester-based polymer, a silicon-based polymer, an acrylic polymer, a polyolefin-based polymer, and a copolymer thereof.

A light shielding layer can be disposed on the lower substrate 111.

The light shielding layer can be formed of a metal material having a light shielding function to block external light from being introduced into a semiconductor layer 124.

For example, the light shielding layer can be formed of a single layer or a multiple layer structure formed of any one or an alloy of opaque metals, such as aluminum (Al), chrome (Cr), tungsten (W), titanium (Ti), nickel (Ni), neodymium (Nd), molybdenum (Mo), and copper (Cu).

Buffer layers 115*a* and 115*b* can be disposed on the lower substrate 111 on which the light shielding layer is disposed.

The buffer layers 115*a* and 115*b* are functional layers which protect various electrodes and wiring lines from impurities such as alkali ions entering from the lower substrate 111 or lower portions and has a multilayered structure which is formed by a first buffer layer 115*a* and a second buffer layer 115*b*, but are not limited thereto. For example, the buffer layers 115*a* and 115*b* can be formed of silicon oxide (SiOx), silicon nitride (SiNx), or multiple layers thereof. The buffer layers 115*a* and 115*b* can be eliminated according to a type of the thin film transistor 120.

The buffer layers 115*a* and 115*b* can include contact holes which expose a part of the light shielding layer.

The thin film transistor 120 can be disposed above the buffer layers 115*a* and 115*b*.

The thin film transistor 120 of the active area AA can be a driving transistor and for the convenience of description, FIG. 5 illustrates only the driving transistor 120. A switching transistor, a sensing transistor, and a compensation circuit can also be included in the electroluminescent display device 100, in addition to the driving transistor.

At this time, the driving transistor 120 transmits a current, which is transmitted through a power line by the signal transmitted from the switching transistor, to the anode 131 and controls the emission by the current which is transmitted to the anode 131.

To this end, the driving transistor 120 includes a gate electrode 121, a semiconductor layer 124, a source electrode 122, and a drain electrode 123.

The switching transistor is turned on by a gate pulse which is supplied to the gate line to transmit the data voltage which is supplied to the data line to the gate electrode 121 of the driving transistor 120.

The semiconductor layer 124 is disposed on the second buffer layer 115*b*.

The semiconductor layer 124 can be configured by poly silicon (p-Si). In this case, a predetermined region can be doped with impurities. Further, the semiconductor layer 124 can be configured by amorphous silicon (a-Si) or various organic semiconductor materials such as pentacene. Moreover, the semiconductor layer 124 can be configured by oxide semiconductor.

The oxide semiconductor has excellent mobility and uniformity. The oxide semiconductor can be configured by an indium tin gallium zinc oxide (InSnGaZnO) based material which is a quaternary metal oxide, an indium gallium zinc oxide (InGaZnO) based material, an indium tin zinc oxide (InSnZnO) based material, an indium aluminum zinc oxide (InAlZnO) based material, a tin gallium zinc oxide (SnGaZnO) based material, an aluminum gallium zinc oxide (AlGaZnO) based material, a tin aluminum zinc oxide (SnAlZnO) based material which are ternary metal oxides, an indium zinc oxide (InZnO) based material, a tin zinc oxide (SnZnO) based material, an aluminum zinc oxide (AlZnO) based material, a zinc magnesium oxide (ZnMgO) based material, and a tin magnesium oxide (SnMgO) based material, which are bimetallic oxides, an indium oxide (InO) based material, a tin oxide (SnO) based material, an indium gallium oxide (InGaO) based material, a zinc oxide (ZnO), or an indium magnesium oxide (InMgO) based material, but a composition ratio of individual elements is not limited.

The semiconductor layer 124 includes a source region and a drain region including a p-type or n-type impurity, and a channel region between the source region and the drain region and further includes a lightly doped region between the source region and the drain region which are adjacent to the channel region.

The source region and the drain region are areas where the impurities are highly doped and the source electrode 122 and the drain electrode 123 of the thin film transistor 120 can be connected thereto, respectively.

As an impurity ion, a p-type impurity or an n-type impurity is used. The p-type impurity can be one of boron (B), aluminum (Al), gallium (Ga), and indium (In) and the n-type impurity can be one of phosphorus (P), arsenic (As), and antimony (Sb).

The channel region can be doped with an n-type impurity or a p-type impurity, depending on the thin film transistor structure of NMOS or PMOS.

The gate insulating layer 115*c* can be disposed on the semiconductor layer 124. For example, the gate insulating layer 115*c* can be formed of an insulating inorganic material such as silicon oxide SiOx or silicon nitride SiNx or an insulating organic material.

The gate electrode 121 is disposed on the gate insulating layer 115*c*. The gate electrode 121 can be formed of various conductive materials, for example, magnesium (Mg), aluminum (Al), nickel (Ni), chrome (Cr), molybdenum (Mo), tungsten (W), gold (Au), or an alloy thereof.

A first interlayer insulating layer **115*d* is disposed on the gate electrode 121 and a second interlayer insulating layer 115*e* is disposed thereon. However, the present disclosure is not limited thereto, so that only the first interlayer insulating layer 115*d*** can be disposed.

The first interlayer insulating layer **115*d* and the second interlayer insulating layer 115*e*** can be formed of silicon oxide (SiOx) or silicon nitride (SiNx), or a multilayered structure thereof.

The source electrode 122 and the drain electrode 123 are disposed above the second interlayer insulating layer **115*e***.

The source electrode 122 and the drain electrode 123 can be configured by a single layer or multiple layers of a metal material, such as chrome (Cr), copper (Cu), aluminum (Al), molybdenum (Mo), gold (Au), titanium (Ti), nickel (Ni), and neodymium (Nd) which are conductive metals or an alloy thereof, but are not limited thereto.

A protection layer **115*f* can be disposed above the thin film transistor 120** configured as described above.

For example, the protection layer **115*f*** can be configured by an inorganic insulating layer such as silicon oxide (SiOx) or silicon nitride (SiNx).

The protection layer **115*f* can serve to suppress unnecessary electrical connection between components above and below the protection layer 115*f* and suppress contamination or damage from the outside. However, the protection layer 115*f* can be omitted in accordance with a configuration and a characteristic of the thin film transistor 120 and the light emitting diode 130**.

The thin film transistor 120 can be classified into an inverted staggered structure and a coplanar structure depending on the position of the components which configure the thin film transistor 120. For example, in the thin film transistor with an inverted staggered structure, the gate electrode can be located on the opposite side of the source electrode and the drain electrode with the semiconductor layer therebetween. As illustrated in FIG. 5, in the thin film transistor 120 with a coplanar structure, the gate electrode 121 can be located on the same side as the source electrode 122 and the drain electrode 123 with respect to the semiconductor layer 124.

Even though in FIG. 5, the thin film transistor 120 with a coplanar structure has been illustrated, it is not limited thereto so that the electroluminescent display device 100 according to the first embodiment of the present disclosure can include a thin film transistor with an inverted staggered structure. Some thin film transistor 120 has a coplanar structure, and the other thin film transistor 120 can have an inverted staggered structure.

A planarization layer **115*g* can be disposed above the thin film transistor 120 to protect the thin film transistor 120, relieve a step caused thereby, and reduce a parasitic capacitance generated between the thin film transistor 120, the light emitting diode 130**, and various wiring lines.

The planarization layer **115*g*** can be formed of one or more materials of acrylic resin, epoxy resin, phenolic resin, polyamides resin, polyimides resin, unsaturated polyesters resin, polyphenylene resin, benzocyclobutene, and polyphenylenesulfides resin, but are not limited thereto.

The planarization layer **115*g* can extend to a part of the non-active area NA, but is not limited thereto. The planarization layer 115*g*** can be disposed such that a side surface is inclined, but is not limited thereto.

The light emitting diode 130 configured by the anode 131, a light emitting unit 132, and the cathode 133 can be disposed on the planarization layer **115*g***.

The anode 131 can be disposed on the planarization layer **115*g***.

The anode 131 is an electrode which serves to supply holes to the light emitting unit 132 and is connected to the thin film transistor 120 by means of a contact hole in the planarization layer **115*g***.

In the case of the bottom emission type, the anode 131 can be configured by indium tin oxide (ITO) and indium zin oxide (IZO) which are transparent conductive materials, but is not limited thereto.

In contrast, in the case of the top emission type, a reflective layer can be further included to reflect emitted light from the anode 131 to be more smoothly emitted to an upper direction in which the cathode 133 is disposed. For example, the anode 131 can have a double-layered structure in which a transparent conductive layer configured by a transparent conductive material and a reflective layer are sequentially laminated. Further, the anode can have a triple-layered structure in which a transparent conductive layer, a reflective layer, and a transparent conductive layer are sequentially laminated and the reflective layer can be silver (Ag) or an alloy including silver.

A bank **115*h* is disposed on the anode 131 and the planarization layer 115*g***.

The bank **115*h* which is disposed above the anode 131 and the planarization layer 115*g*** can partition an area where light is actually emitted, for example, an emission area to define sub pixels SP.

The bank **115*h* can be formed by photolithography after forming a photoresist above the anode 131**. The photoresist refers to a photosensitive resin whose solubility in a developer is changed by the action of light, and a specific pattern can be obtained by exposing and developing the photoresist. The photoresist can be classified into a positive photoresist and a negative photoresist. At this time, the positive photoresist is a photoresist whose solubility of the exposed portion in the developer is increased by the exposure. When the positive photoresist is developed, a pattern from which exposed portion is removed is obtained. The negative photoresist is a photoresist whose solubility of the exposed portion to the developer is lowered by the exposure. When the negative photoresist is developed, a pattern from which non-exposed portion is removed is obtained.

In order to form the light emitting unit 132 of the light emitting diode 130, a fine metal mask (FMM) which is a deposition mask can be used.

In order to suppress a damage which can be caused by contact with the deposition mask disposed on the bank **115*h* and maintain a predetermined distance between the bank 115*h* and the deposition mask, a spacer can be disposed above the bank 115*h***. The spacer is configured by one of polyimide, photoacryl, and benzocyclobutene (BCB) which are transparent organic materials.

At this time, the bank **115*h* of the emission area is removed to expose a part of the anode 131**.

The bank **115*h* can extend to a part of the non-active area NA, but is not limited thereto. For example, the bank 115*h* extends to an inclined side surface of the planarization layer 115*g*** of the non-active area NA so that the side surface is inclined.

The light emitting unit 132 is disposed between the anode 131 and the cathode 133.

The light emitting unit 132 serves to emit light and includes at least one of a hole injection layer (HIL), a hole transport layer (HTL), an emissive layer, an electron transport layer (ETL), and an electron injection layer (EIL). Some components can be omitted depending on the structure or the characteristic of the electroluminescent display device 100. Here, as the light emitting layer, an electroluminescent light emitting layer and an inorganic light emitting layer can be applied.

The hole injection layer is disposed on the anode 131 to smoothly inject the holes.

The hole transport layer is disposed on the hole injection layer to smoothly transmit the holes to the emissive layer.

The light emitting layer is disposed on the hole transport layer and includes a material which emits specific color light to emit specific color light. The light emitting material can be formed using a phosphor or a fluorescent material.

The electron injection layer can be further disposed on the electron transport layer. The electron injection layer is an organic layer which smoothly injects the electrons from the cathode 133 and can be omitted in accordance with the structure and the characteristic of the electroluminescent display device 100.

In the meantime, an electron blocking layer or a hole blocking layer which blocks the flow of holes or electrons is further disposed to be close to the emissive layer. In this case, a phenomenon that when the electrons are injected to the emissive layer, the electrons move from the emissive layer to pass through an adjacent hole transport layer or when the holes are injected to the emissive layer, the holes move from the emissive layer to pass through an adjacent electron transport layer is suppressed. Therefore, the luminous efficiency can be improved.

The light emitting unit 132 can extend and be disposed to a boundary of the active area AA and the non-active area NA, but is not limited thereto.

The cathode 133 can be disposed on the light emitting unit 132.

The cathode 133 serves to supply electrons to the light emitting unit 132. Since the cathode 133 needs to supply electrons, the cathode 133 can be configured by a metal material which is a conductive material having a low work function such as magnesium or silver-magnesium, but is not limited thereto.

In contrast, when the display panel 110 is a top emission type, the cathode 133 can be indium tin oxide (ITO), indium zinc oxide (IZO), indium tin zinc oxide (ITZO), zinc oxide (ZnO), and tin oxide (TiO) based transparent conductive oxide.

The cathode 133 extends and is disposed to a part of the non-active area NA. For example, the cathode 133 can extend and be disposed to the boundary of the active area AA and the non-active area NA to cover the light emitting unit 132, but is not limited thereto.

An encapsulation layer 115*i* can be disposed on the cathode 133.

The encapsulation layer 115*i* can be formed of an inorganic material. In FIG. 5, even though the encapsulation layer 115*i* is illustrated as a single layer, the encapsulation layer 115*i* can include a first inorganic encapsulation layer, an organic encapsulation layer, and a second inorganic encapsulation layer.

Specifically, the first inorganic encapsulation layer can be disposed so as to cover the light emitting diode 130. The first inorganic encapsulation layer can protect the light emitting diode 130 from external moisture, air, or physical impacts. The first inorganic encapsulation layer can be formed to conformally cover the upper surface of the light emitting diode 130. The first inorganic encapsulation layer can be formed of an inorganic material. For example, the first inorganic encapsulation layer can be formed of various inorganic materials, such as silicon nitride (SiNx) or silicon oxide (SiOx).

The organic encapsulation layer can be disposed on the first inorganic encapsulation layer. The organic encapsulation layer can compensate for a step present below the organic encapsulation layer. For example, the step can be generated in the active area AA by the light emitting diode 130 and the thin film transistor 120. The organic encapsulation layer compensates for the step to have a flat upper surface. Further, the organic encapsulation layer can compensate for a step caused by foreign materials present below the organic encapsulation layer. For example, the step can be caused by foreign materials generated while manufacturing components below the organic encapsulation layer or foreign materials entering from the outside. Therefore, the organic encapsulation layer compensates for the step due to the foreign materials to have a flat upper surface The second inorganic encapsulation layer can be disposed on the organic encapsulation layer. The second inorganic encapsulation layer covers the organic encapsulation layer. The second inorganic encapsulation layer can be a protection layer which protects the light emitting diode 130 from moisture, air, or physical impacts. The second inorganic encapsulation layer can be formed to conformally cover the first inorganic encapsulation layer and the organic encapsulation layer. The second inorganic encapsulation layer can be formed of an inorganic material. For example, the second inorganic encapsulation layer can be formed of various inorganic materials, such as silicon nitride (SiNx) or silicon oxide (SiOx), but is not limited thereto.

The encapsulation layer 115*i* extends and is disposed to a part of the non-active area NA. For example, the encapsulation layer 115*i* extends to an inclined side surface of the bank 115*h* of the non-active area NA so that the side surface is inclined, but is not limited thereto.

In the meantime, according to the first embodiment of the present disclosure, a partial area of the bank 115*h* of the non-active area NA adjacent to the active area AA is removed to form at least one alignment hole 165. At this time, even though in FIG. 5, it is illustrated that the encapsulation layer 115*i* is not formed in the alignment hole 165, the present disclosure is not limited thereto, so that the encapsulation layer 115*i* can be formed in the alignment hole 165.

The alignment hole 165 can be disposed to be spaced apart from ends of the cathode 133 and the light emitting unit 132 with a predetermined distance.

The alignment hole 165 can have a circular or a quadrangular cross-section so that guide pins 160 and 160' thereabove can be fitted thereinto. In this case, even though the alignment hole 165 can be disposed so as to correspond to opposite guide pins 160 and 160' one to one, it is not limited thereto. Therefore, the alignment hole is elongated along the periphery of the active area AA or disposed with a quadrangular frame shape over the non-active area NA with four surfaces which encloses the active area AA.

In FIG. 5, a case in which the alignment hole 165 has a wedge shape that becomes narrower toward the bottom is illustrated as an example, but the present disclosure is not limited thereto, and the alignment hole 165 can have the same upper width and lower width.

The alignment holes 165 are disposed in a larger number of columns than the guide pins 160 and 160'. In FIG. 5, the alignment holes 165 are disposed in two columns along the periphery of the active area AA and the guide pins 160 and 160' are disposed in one column, the present disclosure is not limited thereto.

Further, the alignment hole 165 can be formed by removing the bank **115*h*, but is not limited thereto. Therefore, only a part of the thickness of the bank 115*h* is removed to form the alignment hole or a part of the thickness of the planarization layer 115*g* below the bank 115*h*** is also removed to form the alignment hole.

The alignment hole 165 can be formed together when a trench pattern is formed in the bank **115*h*** of the active area AA, but is not limited thereto.

A filler 150 can be disposed on the encapsulation layer **115*i***.

The filler 150 is filled in a space between the encapsulation layer **115*i* and the upper substrate 170**.

The filler 150 can be an adhesive which adheres the encapsulation layer **115*i* and the upper substrate 170. The filler 150 can be a heat-curable, photo-curable, or natural curable adhesive. For example, the filler 150** can be formed of a material such as a barrier pressure sensitive adhesive (B-PSA).

Further, the filler 150 can be a moisture-proofing layer which minimizes permeation of moisture and oxygen into the electroluminescent display device 100. When the lower substrate 111 and the upper substrate 170 are bonded, if a separate material is not filled in a space between the lower substrate 111 and the upper substrate 170, the electroluminescent display device 100 can be relatively vulnerable to moisture and oxygen permeating from the outside. Therefore, the moisture-proofing layer which suppresses the permeation of moisture and oxygen is filled in the space between the lower substrate 111 and the upper substrate 170 to effectively block the moisture and oxygen permeating from the outside. At this time, the filler 150 can be formed of a moisture proof agent which absorbs moisture or suppresses the progress of moisture and oxygen.

The upper substrate 170 can be disposed on the filler 150. The upper substrate 170 can be disposed so as to be opposite to the lower substrate 111. The upper substrate 170 supports various components of the electroluminescent display device 100. Specifically, the upper substrate 170 can include a color filter layer and a black matrix to allow the electroluminescent display device 100 to implement colors, but is not limited thereto.

Further, the guide pins 160 and 160' of the present disclosure are disposed on the upper substrate 170 which is opposite to the alignment hole 165 to be fitted into the alignment hole 165.

The guide pins 160 and 160' have a circular cross-section as illustrated in FIG. 3, or have a quadrangular cross-section as illustrated in FIG. 4, but are not limited thereto.

The guide pins 160 and 160' can be disposed along the periphery of the active area AA inside the dam structure 180, but are not limited thereto.

The guide pins 160 and 160' can be disposed at the corner of the active area AA, but are not limited thereto.

The guide pins 160 and 160' can use a photoresist material having a high aspect ratio, but are not limited thereto.

As described above, according to the present disclosure, the bonding is performed by forming the guide pins 160 and 160' on the upper substrate 170 and forming the alignment hole 165 in the lower substrate 111 to suppress the color mixture defect due to the bonding defect. By doing this, the yield is improved.

In the related art, the upper substrate in which the dam structure is formed and a lower substrate on which the TFT and the light emitting diode are formed are bonded using a vacuum laminator. However, when misalignment is generated during the alignment process, the color mixture defect of the display panel can be caused. For example, after performing the alignment by placing the upper substrate on which the dam structure is formed below and the lower substrate on which the TFT and the light emitting diode are formed above, the bonding is performed by dropping the lower substrate from top to bottom. According to the bonding method through the free fall, the misalignment is generated vertically and horizontally, regardless of a predetermined align value, which causes the color mixture defect of the display panel.

Therefore, according to the first embodiment of the present disclosure, the guide pins 160 and 160' are formed on the upper substrate 170 and the alignment hole 165 is formed on the lower substrate 111 to perform the bonding so that the self-alignment is possible to suppress the color mixture defect. Further, a critical dimension CD of the alignment hole 165 is measured to be utilized as a test key to efficiently manage the yield and the alignment hole 165 is disposed inside the dam structure 180 to optimize the alignment fluctuation.

Further, an alignment value which is deviated during the free fall is corrected by the configuration and the placement of the guide pins 160 and 160' and the alignment hole 165 to improve the yield.

The guide pins 160 and 160' and the alignment hole 165 of the present disclosure are disposed inside the dam structure 180 so that a risk of being used as a moisture permeation path is removed and a bezel width is not increased. By doing this, the reliability is improved and the bezel width is actually reduced.

The dam structure 180 can be formed in the non-active area NA between the lower substrate 111 and the upper substrate 170.

The dam structure 180 is disposed to enclose the filler 150 and is disposed to be in contact with the lower substrate 111 and the upper substrate 170. The dam structure 180 adheres between the lower substrate 111 and the upper substrate 170 to reinforce the adhesiveness of the filler 150 and blocks the moisture and oxygen permeating from a side surface of the electroluminescent display device 100. The dam structure 180 serves as a member for sealing components between the lower substrate 111 and the upper substrate 170 so that it is also referred to as a sealant.

A dam bank 185 is disposed above the lower substrate 111 at the outside of the dam structure 180, but is not limited thereto.

In the meantime, the alignment of the present disclosure can have a quadrangular shape with the same upper width and lower width, which will be described with reference to FIG. 6.

Figure 6:
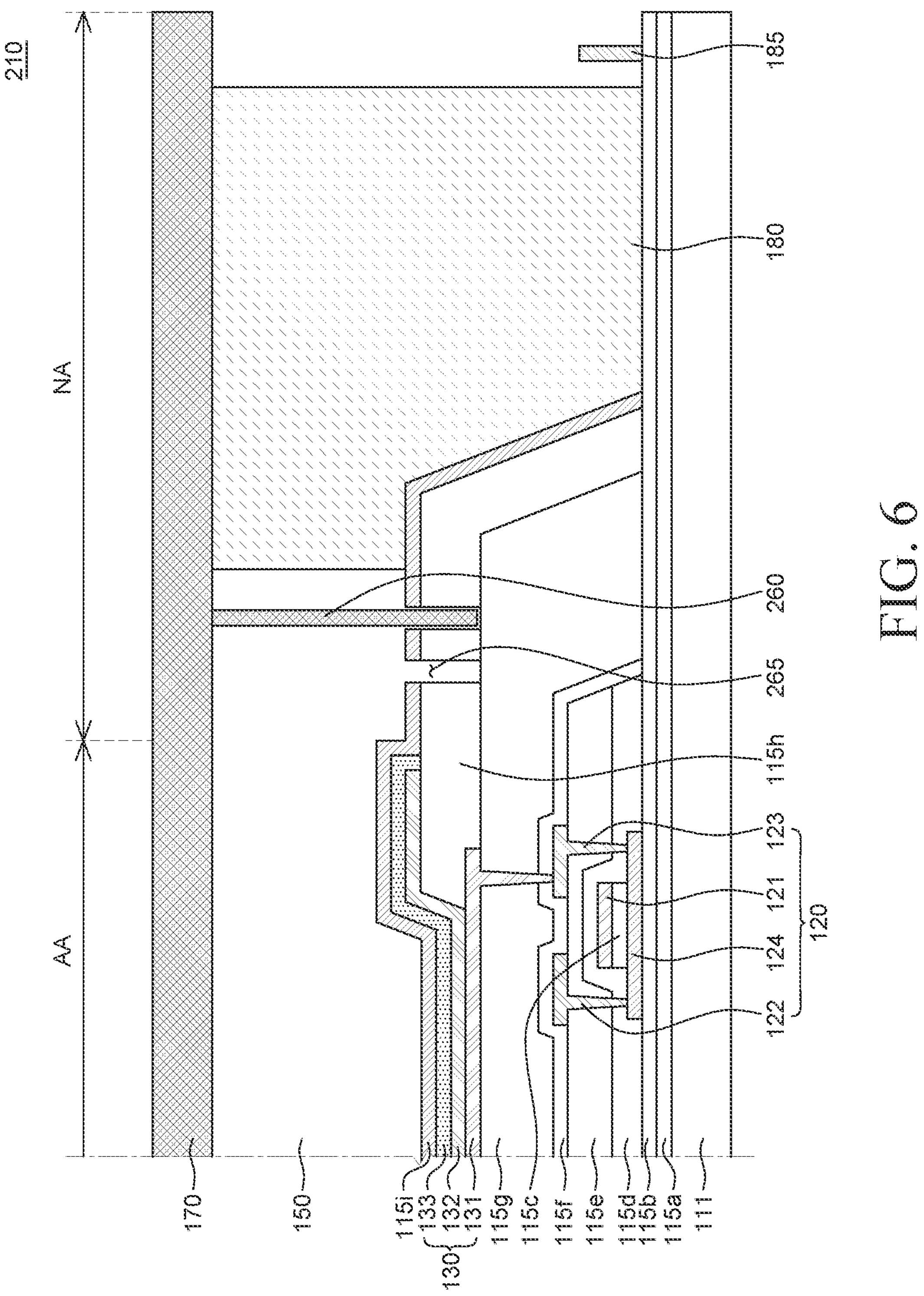
FIG. 6 is a cross-sectional view of a display panel according to a second embodiment of the present disclosure.

FIG. 6 is a cross-sectional view of a display panel according to a second embodiment of the present disclosure.

The only difference between a display panel 210 of the second embodiment of the present disclosure of FIG. 6 and the above-described display panel 110 of FIGS. 3 to 5 is a shape of an alignment hole 265, but the other component is substantially the same so that a redundant description will be omitted or may be provided briefly. The same configuration will be denoted with the same reference numeral.

Referring to FIG. 6, according to the second embodiment of the present disclosure, a partial area of the bank **115*h* of the non-active area NA adjacent to the active area AA is removed to form at least one alignment hole 265. Even though in FIG. 6**, it is illustrated that the encapsulation layer

115*i* is not formed in the alignment hole 265, the present disclosure is not limited thereto, so that the encapsulation layer 115*i* can be formed in the alignment hole 265.

The alignment hole 265 can be disposed to be spaced apart from ends of the cathode 133 and the light emitting unit 132 with a predetermined distance.

The alignment hole 265 can have a circular or a quadrangular cross-section so that a guide pin 260 thereabove can be fitted thereinto. In this case, even though the alignment hole 265 can be disposed so as to correspond to an opposite guide pin 260 one to one, it is not limited thereto. Therefore, the alignment hole is elongated along the periphery of the active area AA or disposed with a quadrangular frame shape over the non-active area NA with four surfaces which enclose the active area AA.

The alignment holes 265 are disposed in a larger number of columns than the guide pin 260. In FIG. 6, it is illustrated that the alignment holes 265 are disposed in two columns along the periphery of the active area AA and the guide pin 260 is disposed in one column, the present disclosure is not limited thereto.

Further, the alignment hole 265 can be formed by removing the bank 115*h*, but is not limited thereto. Therefore, only a part of the thickness of the bank 115*h* is removed to form the alignment hole or a part of the thickness of the planarization layer 115*g* below the bank 115*h* is also removed to form the alignment hole.

The alignment hole 265 can be formed together when a trench pattern is formed in the bank 115*h* of the active area AA, but is not limited thereto.

The guide pin 260 according to the second embodiment of the present disclosure is disposed on the upper substrate 170 which is opposite to the alignment hole 265 to be fitted into the alignment hole 265.

As described above, the guide pin 260 can have a circular or quadrangular cross-section, but is not limited thereto.

The guide pin 260 can be disposed along the periphery of the active area AA inside the dam structure 180, but are not limited thereto.

The guide pin 260 can also be disposed at the corner of the active area AA, but is not limited thereto.

The guide pin 260 can use a photoresist material having a high aspect ratio, but is not limited thereto.

The alignment hole 265 according to the second embodiment of the present disclosure has a quadrangular shape with the same upper width and lower width, but is not limited thereto.

The alignment hole 265 can have a larger diameter or width than that of the guide pin 260 so that the guide pin 260 is fitted thereinto.

In the meantime, the guide pin according to the present disclosure can have an end which has a wedge shape corresponding to a wedge shape of the alignment hole so as to be well fitted into the alignment hole, which will be described with reference to FIG. 7.

Figure 7:
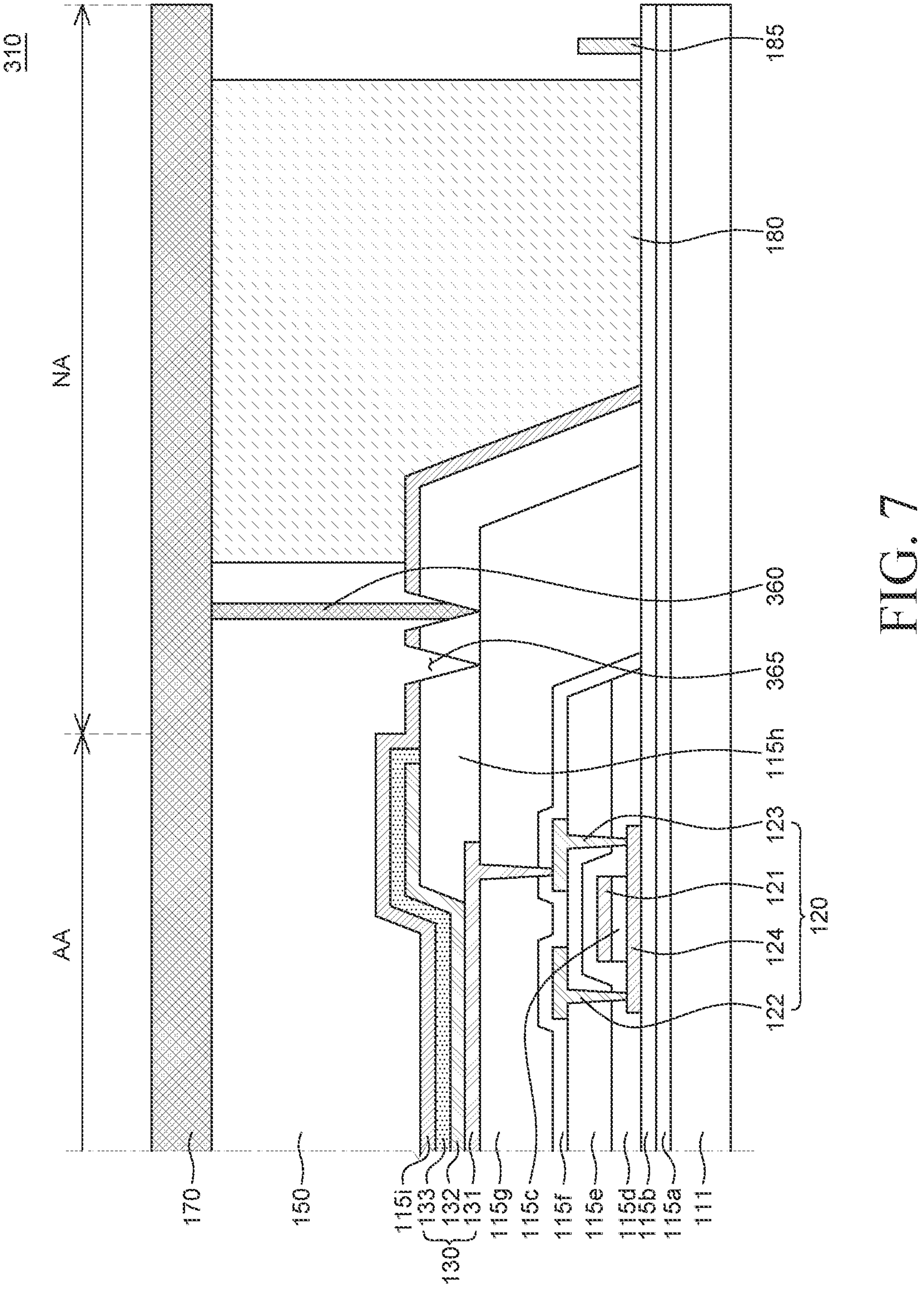
FIG. 7 is a cross-sectional view of a display panel according to a third embodiment of the present disclosure.

FIG. 7 is a cross-sectional view of a display panel according to a third embodiment of the present disclosure.

The only difference between a display panel 310 of the third embodiment of the present disclosure of FIG. 7 and the above-described display panel 110 of FIGS. 3 to 5 is a shape of a guide pin 360, but the other component is substantially the same so that a redundant description will be omitted or may be provided briefly. The same configuration will be denoted with the same reference numeral.

Referring to FIG. 7, according to the third embodiment of the present disclosure, a partial area of the bank 115*h* of the non-active area NA adjacent to the active area AA is removed to form at least one alignment hole 365. Even though in FIG. 7, it is illustrated that the encapsulation layer 115*i* is not formed in the alignment hole 365, the present disclosure is not limited thereto, so that the encapsulation layer 115*i* can be formed in the alignment hole 365.

The alignment hole 365 can be disposed to be spaced apart from ends of the cathode 133 and the light emitting unit 132 with a predetermined distance.

The alignment hole 365 can have a circular or quadrangular cross-section so that guide pin 360 thereabove can be fitted thereinto. In this case, even though the alignment hole 365 can be disposed so as to correspond to an opposite guide pin 360 one to one, it is not limited thereto. Therefore, the alignment hole is elongated along the periphery of the active area AA or disposed with a quadrangular frame shape over the non-active area NA with four surfaces which encloses the active area AA.

The alignment holes 365 are disposed in a larger number of columns than the guide pin 360. In FIG. 7, the alignment holes 365 are disposed in two columns along the periphery of the active area AA and the guide pin 360 is disposed in one column, the present disclosure is not limited thereto.

Further, the alignment hole 365 can be formed by removing the bank 115*h*, but is not limited thereto. Therefore, only a part of the thickness of the bank 115*h* is removed to form the alignment hole or a part of the thickness of the planarization layer 115*g* below the bank 115*h* is also removed to form the alignment hole.

The alignment hole 365 can be formed together when a trench pattern is formed in the bank 115*h* of the active area AA, but is not limited thereto.

The guide pin 360 according to the third embodiment of the present disclosure is disposed on the upper substrate 170 which is opposite to the alignment hole 365 to be fitted into the alignment hole 365.

As described above, the guide pin 360 can have a circular or quadrangular cross-section, but is not limited thereto.

The guide pin 360 can be disposed along the periphery of the active area AA inside the dam structure 180, but is not limited thereto.

The guide pin 360 can also be disposed at the corner of the active area AA, but is not limited thereto.

The guide pin 360 can use a photoresist material having a high aspect ratio, but is not limited thereto.

The alignment hole 365 according to the third embodiment of the present disclosure has a wedge shape that becomes narrower toward the bottom, but the present disclosure is not limited thereto, and the alignment hole 365 can have the same upper width and lower width.

In response to this, the guide pin 360 of the third embodiment of the present disclosure has an end which has a wedge shape corresponding to the wedge shape of the alignment hole 365. By doing this, the guide pin 360 can be well fitted into the alignment hole 365 and more accurate alignment can be achieved.

The alignment hole 365 can have a larger diameter or width than that of the guide pin 360 so that the guide pin 360 is fitted thereinto.

In the meantime, the alignment holes and the guide pins are disposed in a plurality of columns and have different widths depending on the columns, which will be described with reference to FIG. 8.

Figure 8:
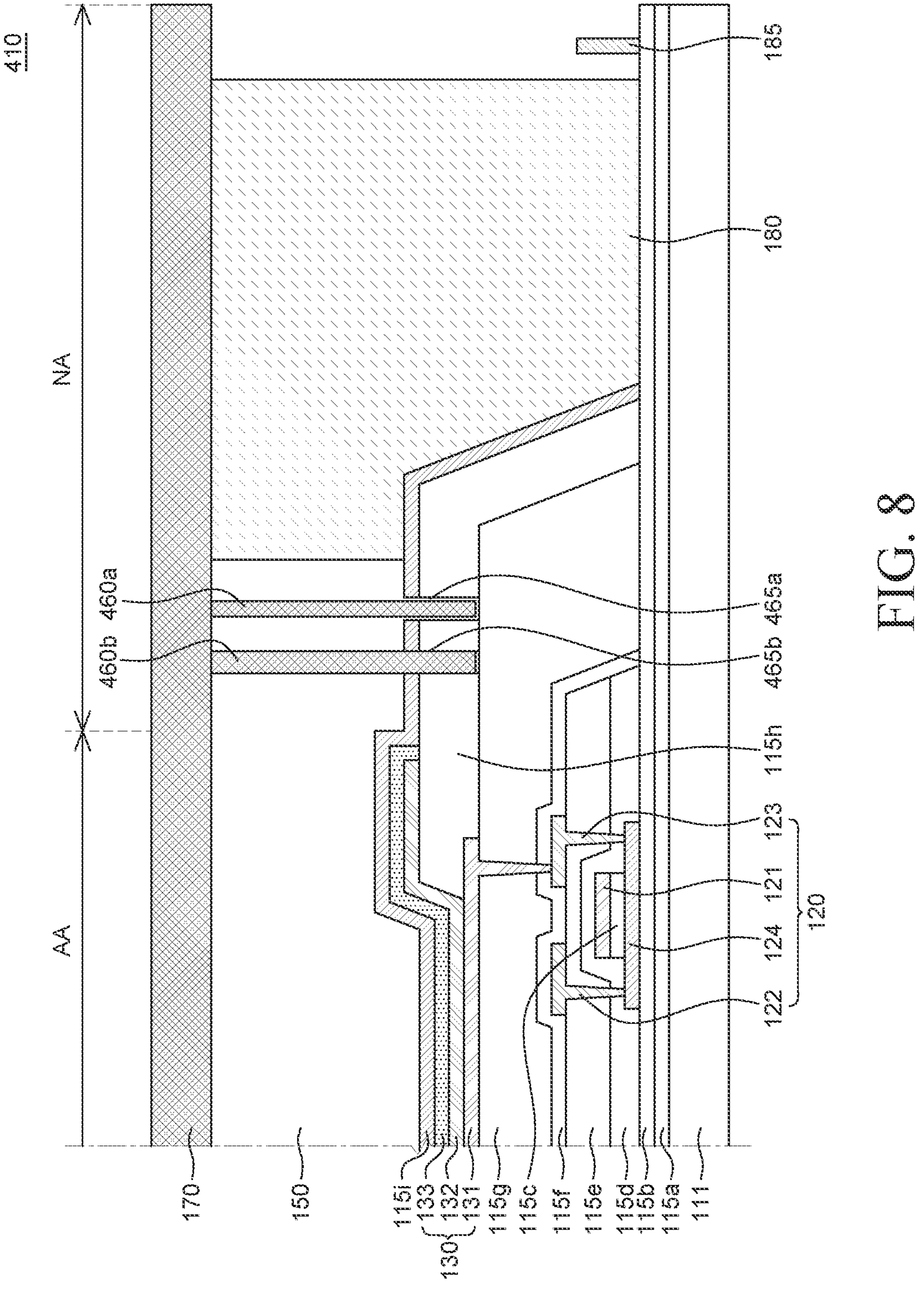
FIG. 8 is a cross-sectional view of a display panel according to a fourth embodiment of the present disclosure.

FIG. 8 is a cross-sectional view of a display panel according to a fourth embodiment of the present disclosure.

The only difference between a display panel 410 of the fourth embodiment of the present disclosure of FIG. 8 and the above-described display panel 210 of FIG. 6 is that alignment holes 465*a* and 465*b* and guide pins 460*a* and 460*b* are disposed in a plurality of columns. However, the other component is substantially the same so that a redundant description will be omitted or may be provided briefly. The same configuration will be denoted with the same reference numeral.

Referring to FIG. 8, according to the fourth embodiment of the present disclosure, a partial area of the bank 115*h* of the non-active area NA adjacent to the active area AA is removed to form a plurality of alignment holes 465*a* and 465*b*. Even though in FIG. 8, it is illustrated that the encapsulation layer 115*i* is not formed in the plurality of alignment holes 465*a* and 465*b*, the present disclosure is not limited thereto, so that the encapsulation layer 115*i* can be formed in the plurality of alignment holes 465*a* and 465*b*.

The plurality of alignment holes 465*a* and 465*b* can be disposed in a plurality of columns. Even though in FIG. 8, it is illustrated that the alignment holes 465*a* and 465*b* are disposed in two columns along the periphery of the active area AA, it is not limited thereto. Further, in response to this, even though it is illustrated that the plurality of guide pins 460*a* and 460*b* are disposed in two columns along the periphery of the active area AA, it is not limited thereto.

The plurality of alignment holes 465*a* and 465*b* are divided into a first alignment hole 465*a* which is disposed to be closer to the outside and a second alignment hole 465*b* which is disposed to be closer to the inside.

The second alignment hole 465*b* has a larger width than the first alignment hole 465*a*, but is not limited thereto.

The second alignment hole 465*b* can be disposed to be spaced apart from ends of the cathode 133 and the light emitting unit 132 with a predetermined distance.

The first and second alignment holes 465*a* and 465*b* can have a circular or a quadrangular cross-section so that the guide pins 460*a* and 460*b* thereabove can be fitted thereinto. In this case, even though the first and second alignment holes 465*a* and 465*b* can be disposed so as to correspond to opposite first and second guide pins 460*a* and 460*b* one to one, it is not limited thereto. Therefore, the alignment hole is elongated along the periphery of the active area AA or disposed with a quadrangular frame shape over the non-active area NA with four surfaces which encloses the active area AA.

Further, the first and second alignment holes 465*a* and 465*b* can be formed by removing the bank 115*h*, but is not limited thereto. Therefore, only a part of the thickness of the bank 115*h* is removed to form the alignment holes or a part of the thickness of the planarization layer 115*g* below the bank 115*h* is also removed to form the alignment holes.

The first and second alignment holes 465*a* and 465*b* can be formed together when a trench pattern is formed in the bank 115*h* of the active area AA, but is not limited thereto.

The first and second guide pins 460*a* and 460*b* according to the fourth embodiment of the present disclosure are disposed on the upper substrate 170 which is opposite to the first and second alignment holes 465*a* and 465*b* to be fitted into the first and second alignment holes 465*a* and 465*b*.

At this time, the first guide pin 460*a* can be disposed to be closer to the outside and the second guide pin 460*b* can be disposed to be closer to the inside. Accordingly, the first guide pin 460*a* is fitted into the first alignment hole 465*a* and the second guide pin 460*b* is fitted into the second alignment hole 465*b*.

The second guide pin 460*b* has a larger width than the first guide pin 460*a*, but is not limited thereto.

As described above, the first and second guide pins 460*a* and 460*b* can have a circular or quadrangular cross-section, but are not limited thereto.

The first and second guide pins 460*a* and 460*b* can be disposed along the periphery of the active area AA inside the dam structure 180, but are not limited thereto.

The first and second guide pins 460*a* and 460*b* can also be disposed at the corner of the active area AA, but are not limited thereto.

The first and second guide pins 460*a* and 460*b* can use a photoresist material having a high aspect ratio, but is not limited thereto.

The first and second alignment holes 465*a* and 465*b* and the first and second guide pins 460*a* and 460*b* according to the fourth embodiment of the present disclosure can have the same upper width and lower width, but are not limited thereto.

The first and second alignment holes 465*a* and 465*b* can have a larger diameter or width than the first and second guide pins 460*a* and 460*b* to be fitted into the first and second guide pins 460*a* and 460*b*.

According to the fourth embodiment of the present disclosure, the second alignment hole 465*b* and the second guide pin 460*b* have a larger width than the first alignment hole 465*a* and the first guide pin 460*a*. Therefore, it is advantageous in that even though the alignment by the first alignment hole 465*a* and the first guide pin 460*a* fails, the subsequent alignment by the second alignment hole 465*b* and the second guide pin 460*b* to perform accurate bonding.

As described above, even though in FIG. 8, it is illustrated that the plurality of alignment holes 465*a* and 465*b* and the plurality of guide pins 460*a* and 460*b* are disposed in two columns, respectively, the present disclosure is not limited thereto so that the alignment holes and the guide pins can be disposed in three or more columns. At this time, in each column, the alignment holes and the guide pins can have different widths.

In the meantime, the alignment hole of the present disclosure can be formed by removing also a part of the thickness of the planarization layer below the bank, which will be described with reference to FIG. 9.

Figure 9:
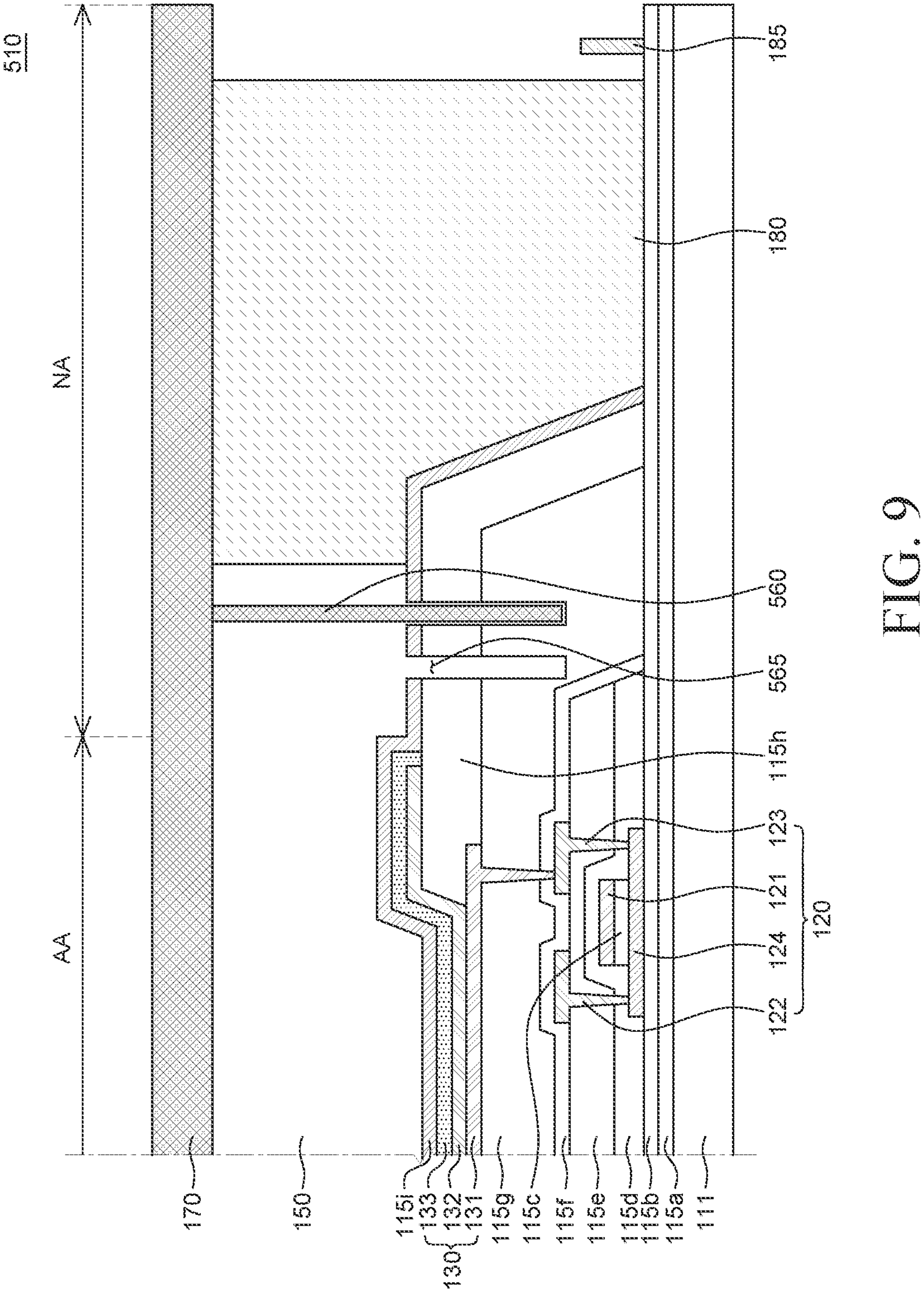
FIG. 9 is a cross-sectional view of a display panel according to a fifth embodiment of the present disclosure.

FIG. 9 is a cross-sectional view of a display panel according to a fifth embodiment of the present disclosure.

The only difference between a display panel 510 of the fifth embodiment of the present disclosure of FIG. 9 and the above-described display panel 210 of FIG. 6 is a shape of an alignment hole 565, but the other component is substantially the same so that a redundant description will be omitted or may be provided briefly. The same configuration will be denoted with the same reference numeral.

Referring to FIG. 9, according to the fifth embodiment of the present disclosure, not only a partial area of the bank 115*h* of the non-active area NA adjacent to the active area AA, but also a part of the thickness of the planarization layer 115*g* is removed to form a plurality of alignment holes 565.

The alignment hole 565 can be disposed to be spaced apart from ends of the cathode 133 and the light emitting unit 132 with a predetermined distance.

The alignment hole 565 can have a circular or a quadrangular cross-section so that guide pin 560 thereabove can be fitted thereinto. In this case, even though the alignment hole 565 can be disposed so as to correspond to an opposite guide pin 560 one to one, it is not limited thereto. Therefore, the alignment hole is elongated along the periphery of the active area AA or disposed with a quadrangular frame shape over the non-active area NA with four surfaces which encloses the active area AA.

The alignment holes 565 are disposed in a larger number of columns than the guide pin 560. In FIG. 9, it is illustrated that the alignment holes 565 are disposed in two columns along the periphery of the active area AA and the guide pin 560 is disposed in one column, the present disclosure is not limited thereto.

The alignment hole 565 can be formed together when a trench pattern is formed in a part of the thickness of the bank 115*h* and the planarization layer 115*g* of the active area AA, but is not limited thereto.

The guide pin 560 according to the fifth embodiment of the present disclosure is disposed on the upper substrate 170 which is opposite to the alignment hole 565 to be fitted into the alignment hole 565.

As described above, the guide pin 560 can have a circular or quadrangular cross-section, but is not limited thereto.

The guide pin 560 can be disposed along the periphery of the active area AA inside the dam structure 180, but are not limited thereto.

The guide pin 560 can also be disposed at the corner of the active area AA, but is not limited thereto.

The guide pin 560 can use a photoresist material having a high aspect ratio, but is not limited thereto.

The alignment hole 565 according to the fifth embodiment of the present disclosure has a quadrangular shape with the same upper width and lower width, but is not limited thereto.

The alignment hole 565 can have a larger diameter or width than that of the guide pin 560 so that the guide pin 560 is fitted thereinto.

As described above, according to the fifth embodiment of the present disclosure, not only a partial area of the bank 115*h* of the non-active area NA adjacent to the active area AA, but also a part of the thickness of the planarization layer 115*g* is removed to form a plurality of alignment holes 565.

Further, in response to this, the guide pin 560 is also formed to have a longer length to be sufficiently inserted into the alignment hole 565 to be fitted. Therefore, more accurate alignment is possible.

In the meantime, individual electroluminescent display devices can be manufactured by forming, bonding, and scribing a plurality of lower substrates and upper substrates on a large-size mother substrate. The guide pin and the alignment hole of the present disclosure can be more effectively formed while manufacturing the plurality of electroluminescent display device on the large-size mother substrate, which will be described in detail with reference to FIGS. 10 to 13.

Figure 10:
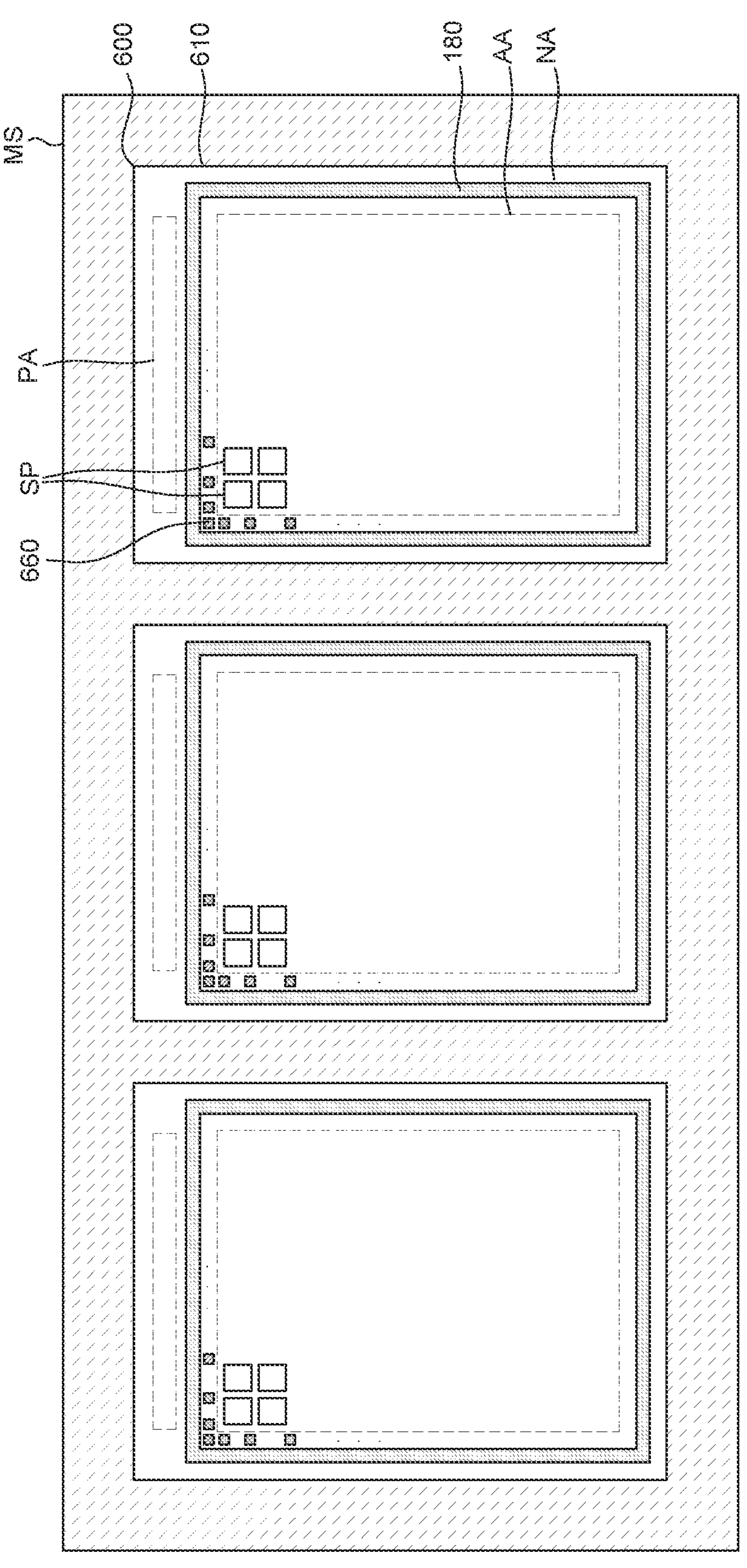
FIG. 10 is a view illustrating a plurality of display panels disposed on a mother substrate.

FIG. 10 is a view illustrating a plurality of display panels disposed on a mother board.

Figure 11:
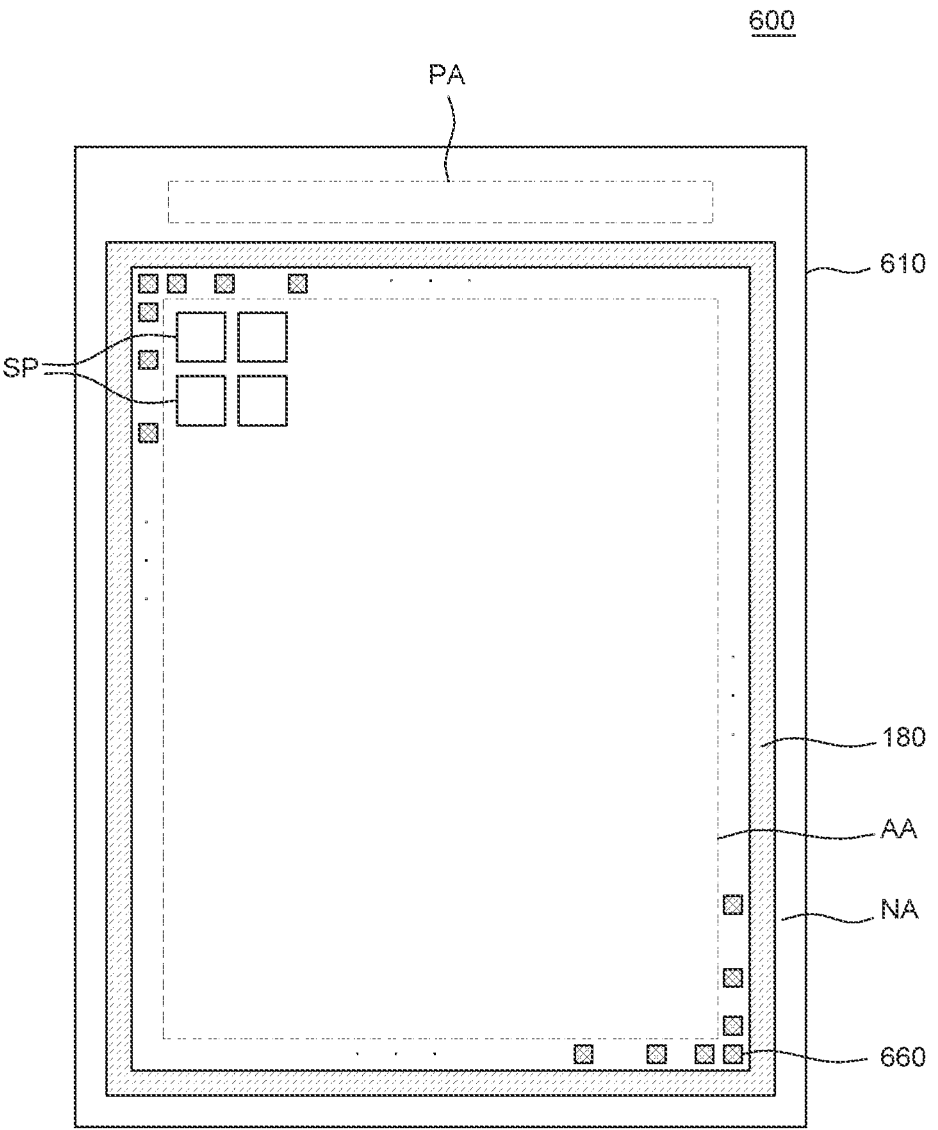
FIG. 11 is a plan view of an electroluminescent display device according to a sixth embodiment of the present disclosure.

FIG. 11 is a plan view of an electroluminescent display device according to a sixth embodiment of the present disclosure.

Referring to FIG. 10, three display panels 610 can be disposed on a large-size mother substrate MS, but the present disclosure is not limited to the number of display panels 610 disposed on the mother substrate MS.

In FIG. 10, an example that a lower substrate and an upper substrate are manufactured and bonded on each mother substrate MS to manufacture three electroluminescent display devices 600 including a display panel 610 is illustrated.

Referring to FIGS. 10 and 11, the electroluminescent display device 600 according to the sixth embodiment of the present disclosure includes a display panel 610 which is divided into an active area AA and a non-active area NA.

Even though in FIGS. 10 and 11, the non-active area NA encloses a quadrangular active area AA, shapes and placements of the active area AA and the non-active area NA are not limited to the example illustrated in FIGS. 10 and 11.

For example, the active area AA and the non-active area NA can have shapes suitable for a design of an electronic device including the electroluminescent display device 600. For example, another exemplary shape of the active area AA can be a pentagon, a hexagon, a circle, or an oval and the non-active area NA can have an arbitrary shape which encloses the active area AA.

The non-active area NA includes a pad area PA.

The pad area PA can be disposed at the outside of a dam structure 180 disposed in the non-active area NA. The pad area PA can be disposed on one side of the lower substrate, and the shape and the placement of the pad area PA are not limited thereto.

In the meantime, according to the sixth embodiment of the present disclosure, a plurality of alignment holes and guide pins 660 is formed in the non-active area NA adjacent to the active area AA.

The alignment hole can have a circular or a quadrangular cross-section so that guide pin 660 thereabove can be fitted thereinto. In this case, even though the alignment hole can be disposed so as to correspond to an opposite guide pin 660 one to one, it is not limited thereto. Therefore, the alignment hole is elongated along the periphery of the active area AA or disposed with a quadrangular frame shape over the non-active area NA with four surfaces which encloses the active area AA.

As described above, the guide pin 660 can have a circular or quadrangular cross-section, but is not limited thereto.

The guide pin 660 can be disposed along the periphery of the active area AA inside the dam structure 180, but are not limited thereto.

The guide pin 660 can also be disposed at the corner of the active area AA, but is not limited thereto.

The alignment hole can have a larger diameter or width than that of the guide pin 660 so that the guide pin 660 is fitted thereinto.

The plurality of guide pins 660 according to the sixth embodiment of the present disclosure has different densities.

For example, for example, the plurality of guide pins 660 can be disposed such that densities are reduced toward the vertical direction and/or horizontal direction from the corner of the active area AA. Here, the density can be controlled by the number of guide pins 660 which is disposed in a unit area.

For example, the density is differentiated at a ratio of 1:2:4 with respect to neighboring first position: second position: third position so that when the alignment in the first position fails, the alignment is performed by the guide pin 660 in the second position and the third position. Therefore, the alignment accuracy can be improved. Here, when the third position refers to an upper left corner of the display panel 610, the second position is a position adjacent to the right side or the lower side of the third position and the first position can be a position adjacent to the right side or the lower side of the second position.

The plurality of guide pins 660 can have different densities to be vertically and/or horizontally symmetrical to the display panel 610.

When the plurality of alignment holes is disposed so as to correspond to the plurality of guide pins 660, the plurality of alignment holes can differentiate the density in accordance with the placement of the corresponding guide pin 660.

Figure 12:
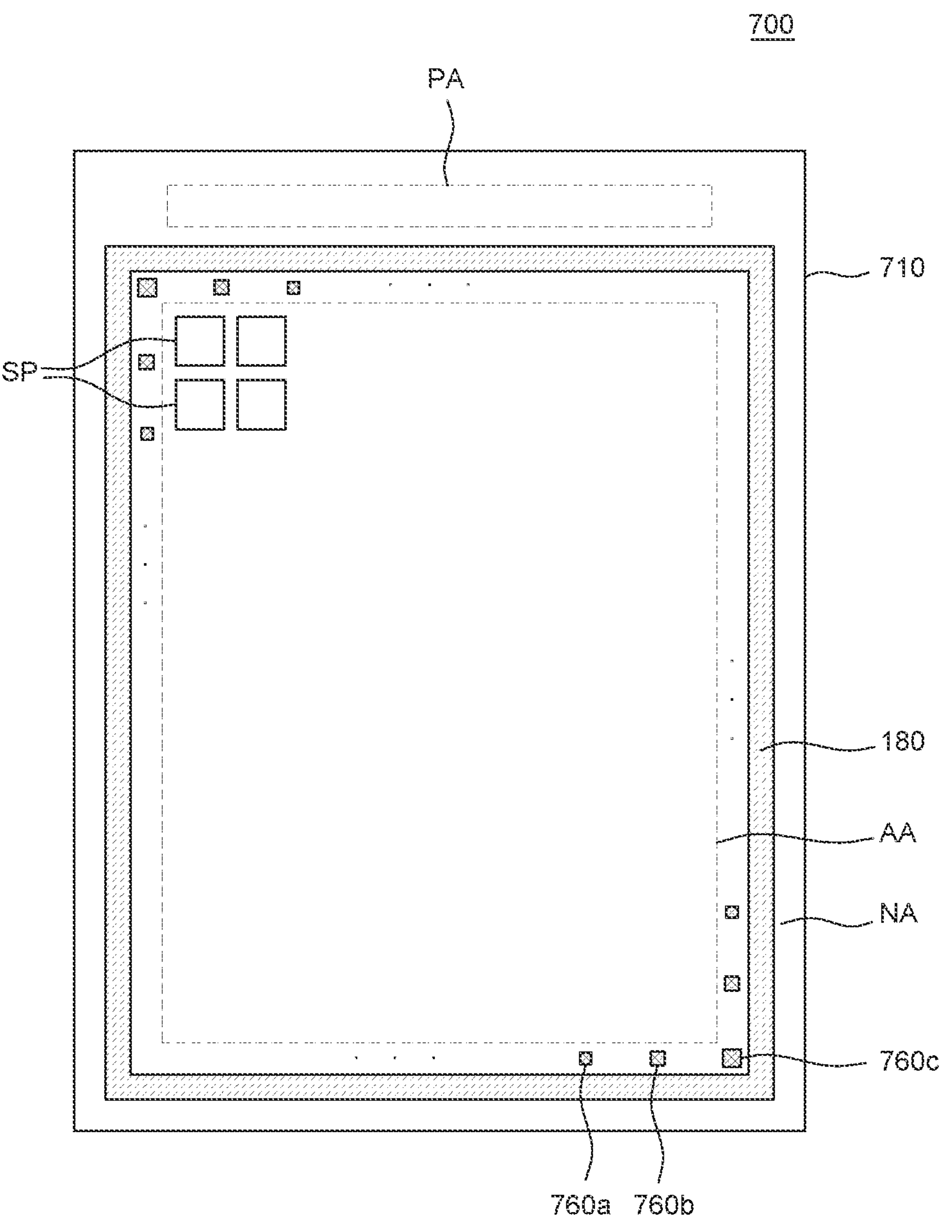
FIG. 12 is a plan view of an electroluminescent display device according to a seventh embodiment of the present disclosure.

FIG. 12 is a plan view of an electroluminescent display device according to a seventh embodiment of the present disclosure.

The only difference between an electroluminescent display device 700 of the seventh embodiment of the present disclosure of FIG. 12 and the above-described electroluminescent display device 600 of FIGS. 10 and 11 is shapes of guide pins 760*a*, 760*b*, 760*c* and alignment holes. However, the other component is substantially the same so that a redundant description will be omitted or may be provided briefly. The same configuration will be denoted with the same reference numeral.

Referring to FIG. 12, the electroluminescent display device 700 according to the seventh embodiment of the present disclosure includes a display panel 710 which is divided into an active area AA and a non-active area NA.

According to the seventh embodiment of the present disclosure, the plurality of alignment holes and guide pins 760*a*, 760*b*, 760*c* is disposed in the non-active area NA adjacent to the active area AA, for example, between the active area AA and the dam structure 180.

The alignment holes can have a circular or a quadrangular cross-section so that guide pins 760*a*, 760*b*, 760*c* thereabove can be fitted thereinto. In this case, even though the alignment hole can be disposed so as to correspond to opposite guide pins 760*a*, 760*b*, 760*c* one to one, it is not limited thereto. Therefore, the alignment hole is elongated along the periphery of the active area AA or disposed with a quadrangular frame shape over the non-active area NA with four surfaces which encloses the active area AA.

As described above, the guide pins 760*a*, 760*b*, 760*c* can have a circular or quadrangular cross-section, but is not limited thereto.

The guide pins 760*a*, 760*b*, 760*c* can be disposed along the periphery of the active area AA inside the dam structure 180, but are not limited thereto.

The guide pins 760*a*, 760*b*, 760*c* can be disposed at the corner of the active area AA, but is not limited thereto.

The alignment hole can have a larger diameter or width than that of the guide pins 760*a*, 760*b*, 760*c* so that the opposite guide pins 760*a*, 760*b*, 760*c* are fitted thereinto.

The plurality of guide pins 760*a*, 760*b*, 760*c* according to the seventh embodiment of the present disclosure has different cross-sectional areas depending on the position.

For example, for example, the plurality of guide pins 760*a*, 760*b*, 760*c* can be disposed such that cross-sectional areas are reduced toward the vertical direction and/or horizontal direction from the corner of the active area AA. Here, the cross-sectional area can refer to an area with respect to the cross-sections of the guide pins 760*a*, 760*b*, 760*c* which are fitted into the alignment hole.

For example, the cross-sectional area arrangement is differentiated at a ratio of 1:2:4 with respect to neighboring first position: second position: third position so that when the alignment by the guide pin 760*a* of the first position fails, the alignment is performed by the guide pins 760*b* and 760*c* in the second position and the third position. Therefore, the alignment accuracy can be improved.

Here, when the third position denotes an upper left corner of the display panel 710, the second position is a position adjacent to the right side or the lower side of the third position and the first position can be a position adjacent to the right side or the lower side of the second position.

The plurality of guide pins 760*a*, 760*b*, 760*c* can differentiate cross-sectional areas to be vertically and/or horizontally symmetrical to the display panel 710.

When the plurality of alignment holes is disposed so as to correspond to the plurality of guide pins 760*a*, 760*b*, 760*c*, the plurality of alignment holes can differentiate the cross-sectional areas in accordance with the placement of the corresponding guide pins 760*a*, 760*b*, 760*c*.

Figure 13:
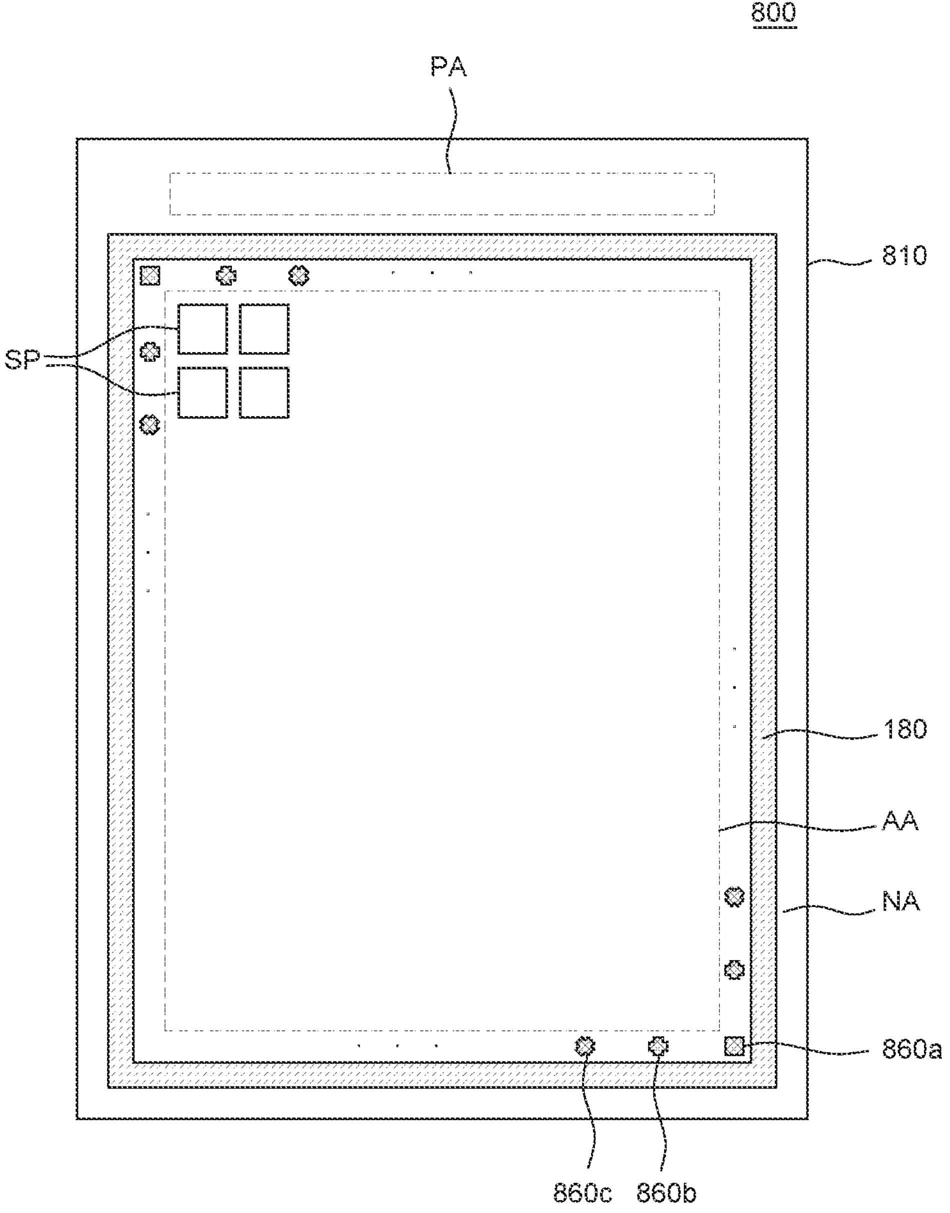
FIG. 13 is a plan view of an electroluminescent display device according to an eighth embodiment of the present disclosure.

FIG. 13 is a plan view of an electroluminescent display device according to an eighth embodiment of the present disclosure.

The only difference between an electroluminescent display device 800 of the eighth embodiment of the present disclosure of FIG. 13 and the above-described electroluminescent display device 600 of FIGS. 10 and 11 is shapes of guide pins 860*a*, 860*b*, 860*c* and alignment holes. However, the other component is substantially the same so that a redundant description will be omitted or may be provided briefly. The same configuration will be denoted with the same reference numeral.

Referring to FIG. 13, the electroluminescent display device 800 according to the eighth embodiment of the present disclosure includes a display panel 810 which is divided into an active area AA and a non-active area NA.

According to the eighth embodiment of the present disclosure, the plurality of alignment holes and guide pins 860*a*, 860*b*, 860*c* is disposed in the non-active area NA adjacent to the active area AA, for example, between the active area AA and the dam structure 180.

The alignment holes can have a circular or a quadrangular cross-section so that guide pins 860*a*, 860*b*, 860*c* thereabove can be fitted thereinto. In this case, even though the alignment hole can be disposed so as to correspond to opposite guide pin 860*a*, 860*b*, 860*c* one to one, it is not limited thereto. Therefore, the alignment hole is elongated along the periphery of the active area AA or disposed with a quadrangular frame shape over the non-active area NA with four surfaces which encloses the active area AA.

The guide pins 860*a*, 860*b*, 860*c* according to the eighth embodiment of the present disclosure includes a first guide pin 860*a* having a circular or quadrangular cross-section, a second guide pin 860*b* having a cross-shaped cross-section, and a third guide pin 860*c* having a snowflake shaped cross-section.

When the first guide pin 860*a* is disposed at an upper left corner of the display panel 810, the second guide pin 860*b* is disposed to be adjacent to the right side or the lower side of the first guide pin 860*a*, and the third guide pin 860*c* is disposed to be adjacent to the right side or the lower side of the second guide pin 860*b*, but is not limited thereto.

The first, second and third guide pins 860*a*, 860*b*, 860*c* can be disposed along the periphery of the active area AA inside the dam structure 180, but are not limited thereto.

The alignment hole can have a larger diameter or width than that of the guide pins 860*a*, 860*b*, 860*c* so that the opposite guide pins 860*a*, 860*b*, 860*c* are fitted thereinto.

The plurality of guide pins 860*a*, 860*b*, 860*c* according to the eighth embodiment of the present disclosure applies different shapes for the alignment depending on the position.

For example, the first guide pin 860*a* having a circular or quadrangular cross-section is disposed at the upper left corner of the display panel, the second guide pin 860*b* having a cross-shaped cross-section is disposed in a position adjacent to the right side or the lower side of the first guide pin 860*a*. Further, the third guide pin 860*c* having a snowflake-shaped cross-section is disposed in a position adjacent to the right side or the lower side of the second guide pin 860*b*. By doing this, the alignment is performed.

In this case, an actual alignment value is inferred by the first, second, and third guide pins 860*a*, 860*b*, and 860*c* to be utilized as process data.

After performing the alignment by the first guide pin 860*a*, an alignment value deviated in the X and Y directions is identified by the second guide pin 860*b* to feedback the value to the process. Further, a value of a deviated alignment angle is identified by the third guide pin 860*c* to feedback the value to the process.

At this time, the plurality of guide pins 860*a*, 860*b*, 860*c* can differentiate the shapes to be vertically and/or horizontally symmetrical to the display panel 810.

In the meantime, when guide pins having an "L" shaped, cross-shaped, or snowflake shaped cross-section are provided at the corner of the active area, even though the angle between the upper and lower substrates is deviated, the alignment precision can be improved.

The embodiments of the present disclosure can also be described as follows:

According to an aspect of the present disclosure, there is provided an electroluminescent display device. The electroluminescent display device includes a lower substrate which is divided into an active area and a non-active area, a thin film transistor disposed above the lower substrate, a planarization layer disposed above the thin film transistor, a light emitting diode which is disposed above the planarization layer and is configured by an anode, a light emitting unit, and a cathode, a bank which is disposed on the planarization layer to partition an emission area, an upper substrate which is opposite to the lower substrate, a filler which is filled in a space between the upper substrate and the light emitting diode, a dam structure which encloses the filler in the non-active area, a plurality of alignment holes which is disposed between the active area and the dam structure and is provided by removing the bank and a plurality of guide pins which is provided on the upper substrate of the non-active area to be fitted into the plurality of alignment holes.

The planarization layer can extend to a part of the non-active area, a side surface of the extending planarization layer can be configured to be inclined, and the bank can extend to cover the inclined side surface of the planarization layer of the non-active area so that a side surface is disposed to be inclined.

The electroluminescent display device can further include an encapsulation layer disposed on the cathode and the bank, wherein the filler can be filled in a space between the upper substrate and the encapsulation layer.

The encapsulation layer can extend to cover the inclined side surface of the bank of the non-active area so that a side surface is disposed to be inclined.

The plurality of alignment holes can be provided by removing a part of thicknesses of the bank and the planarization layer inside the dam structure.

The alignment hole can be spaced apart from ends of the cathode and the light emitting unit with a predetermined distance therebetween.

The alignment hole and the guide pin can have circular or quadrangular cross-sections and the alignment hole can have a diameter or width larger than that of the guide pin.

The plurality of alignment holes can be disposed in the number of corresponding to the plurality of guide pins facing each other.

The alignment hole can be disposed to be elongated along the periphery of the active area.

The alignment hole can be disposed over the non-active area having four side surfaces which encloses the periphery of the active area.

The guide pin can be disposed inside the dam structure along the periphery of the active area.

The alignment hole can have a wedged shape having a width which becomes narrower toward the bottom or has the same upper width and lower width.

The guide pin can have an end having a wedged shape corresponding to the wedged shape of the alignment hole.

The plurality of alignment holes and the plurality of guide pins can be disposed in a plurality of columns and can have different widths depending on the columns.

The plurality of guide pins can have different densities (a different number of guide pins disposed per unit area) or different cross-sections (a different area of the cross-section of the guide pin which is fitted into the alignment hole) depending on the position.

The plurality of guide pins can be disposed to have the density or the cross-sectional area which is reduced from the corner of the active area to the horizontal and/or vertical direction.

The plurality of guide pins can differentiate the density or the cross-sectional area so as to be horizontally and/or vertically symmetrical to the display panel.

The plurality of alignment holes can differentiate the density or the cross-sectional area depending on the placement of the corresponding guide pin.

The plurality of guide pins can include a first guide pin having a circular or quadrangular cross-section, a second guide pin having a cross-shaped cross-section, and a third guide pin having a snowflake shaped cross-section.

The guide pin can be disposed at the corner of the display panel with an "L" shape, a cross-shape, or a snowflake shape.

Although the embodiments of the present disclosure have been described in detail with reference to the accompanying drawings, the present disclosure is not limited thereto and can be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto.

Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An electroluminescent display device, comprising:

a lower substrate divided into an active area and a non-active area;

a thin film transistor disposed above the lower substrate;

a planarization layer disposed above the thin film transistor;

a light emitting diode disposed above the planarization layer, and including an anode, a light emitting unit, and a cathode;

a bank disposed on the planarization layer to partition an emission area;

an upper substrate disposed opposite to the lower substrate;

a filler filled in a space between the upper substrate and the light emitting diode;

a dam structure enclosing the filler in the non-active area;

a plurality of alignment holes disposed between the active area and the dam structure, and provided by removing a portion of the bank; and a plurality of guide pins provided on the upper substrate of the non-active area to be fitted into the plurality of alignment holes, wherein the plurality of guide pins are in contact with the filler, and wherein the plurality of guide pins are disposed within the filler.

2. The electroluminescent display device according to claim 1, wherein the planarization layer extends to a part of the non-active area, a side surface of the extending planarization layer is configured to be inclined, and the bank extends to cover the inclined side surface of the planarization layer of the non-active area so that a side surface of the bank is disposed to be inclined.

3. The electroluminescent display device according to claim 2, further comprising:

an encapsulation layer disposed on the cathode and the bank, wherein the filler is filled in a space between the upper substrate and the encapsulation layer, and wherein the encapsulation layer extends to cover the inclined side surface of the bank of the non-active area so that a side surface of the encapsulation layer is disposed to be inclined.

4. The electroluminescent display device according to claim 3, wherein the plurality of alignment holes are provided by removing a part of thicknesses of the bank and the planarization layer inside the dam structure.

5. The electroluminescent display device according to claim 1, wherein one of the plurality of alignment holes is spaced apart from ends of the cathode and the light emitting unit with a predetermined distance therebetween.

6. The electroluminescent display device according to claim 1, wherein one of the plurality of alignment holes and one of the plurality of guide pins have circular or quadrangular cross-sections and the one alignment hole has a diameter or width larger than that of the one guide pin.

7. The electroluminescent display device according to claim 1, wherein the plurality of alignment holes are disposed in number to correspond to the plurality of guide pins facing each other.

8. The electroluminescent display device according to claim 7, wherein one of the plurality of guide pins is disposed inside the dam structure along a periphery of the active area.

9. The electroluminescent display device according to claim 1, wherein one of the plurality of alignment holes is disposed to be elongated along a periphery of the active area.

10. The electroluminescent display device according to claim 9, wherein the one alignment hole is disposed over the non-active area having four side surfaces which encloses the periphery of the active area.

11. The electroluminescent display device according to claim 1, wherein one of the plurality of alignment holes has either (i) a wedged shape having a width which becomes narrower toward a bottom, or (ii) an upper width equal to a lower width.

12. The electroluminescent display device according to claim 11, wherein one of the plurality of guide pins has an end having a wedged shape corresponding to the wedged shape of the one alignment hole.

13. The electroluminescent display device according to claim 1, wherein the plurality of alignment holes and the plurality of guide pins are disposed in a plurality of columns and have different widths depending on the columns.

14. The electroluminescent display device according to claim 1, wherein, depending on respectively positions of the plurality of guide pins, the plurality of guide pins have either (i) different densities being a different number of guide pins disposed per unit area, or (ii) different cross-sections being a different area of the cross-section of the guide pin which is fitted into an alignment hole.

15. The electroluminescent display device according to claim 14, wherein the plurality of guide pins are disposed to have a density or the cross-sectional area which is reduced from a corner of the active area to a horizontal and/or vertical direction.

16. The electroluminescent display device according to claim 14, wherein the plurality of guide pins differentiate the density or the cross-sectional area so as to be horizontally and/or vertically symmetrical to a display panel.

17. The electroluminescent display device according to claim 14, wherein the plurality of alignment holes differentiate the density or the cross-sectional area depending on a placement of a corresponding guide pin.

18. The electroluminescent display device according to claim 1, wherein the plurality of guide pins include a first guide pin having a circular or quadrangular cross-section, a second guide pin having a cross-shaped cross-section, and a third guide pin having a snowflake shaped cross-section.

19. The electroluminescent display device according to claim 1, wherein one of the plurality of guide pins is disposed at a corner of a display panel with an "L" shape, a cross-shape, or a snowflake shape.

* * * * *